United States Patent
Nishioka

(10) Patent No.: US 6,784,057 B2
(45) Date of Patent: Aug. 31, 2004

(54) SEMICONDUCTOR DEVICE AND NONVOLATILE SEMICONDUCTOR MEMORY DEVICE COMPRISING A PLURALITY OF SEMICONDUCTOR ELEMENTS AS WELL AS PROCESS FOR THE SAME

(75) Inventor: Naho Nishioka, Hyogo (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 09/920,951

(22) Filed: Aug. 3, 2001

(65) Prior Publication Data

US 2002/0117708 A1 Aug. 29, 2002

(30) Foreign Application Priority Data

Feb. 2, 2001 (JP) ........................................ 2001-026389

(51) Int. Cl.[7] ............................................. H01L 21/336
(52) U.S. Cl. ...................... 438/258; 438/257; 438/261; 438/264; 438/287; 438/591; 438/593
(58) Field of Search ................................ 438/257, 258, 438/261, 264, 287, 591, 593

(56) References Cited

U.S. PATENT DOCUMENTS 5,104,819 A * 4/1992 Freiberger et al. ............ 437/43
5,656,522 A * 8/1997 Komori et al. ............. 438/258
5,656,840 A * 8/1997 Yang .......................... 257/316
5,856,221 A * 1/1999 Clementi et al. ........... 438/258
6,235,585 B1 * 5/2001 Lee et al. .................... 438/258

FOREIGN PATENT DOCUMENTS

| JP | 11-31799 | 2/1999 |
| KR | 0155581 | 12/1995 |
| KR | 1999-015387 | 3/1999 |

* cited by examiner

Primary Examiner—Jerome Jackson
Assistant Examiner—N. Drew Richards
(74) Attorney, Agent, or Firm—McDermott Will & Emery LLP

(57) ABSTRACT

A semiconductor device of which the process is simplified so that the manufacturing cost can be reduced and, at the same time, which has a semiconductor element that can control a current of high voltage is provided. The semiconductor device includes first and second semiconductor elements and the first semiconductor element includes a lower electrode formed above a substrate, an intermediate insulating film formed on the lower electrode and an upper electrode formed on the insulating film. The second semiconductor element includes a gate insulating film, which is formed on the substrate and which includes the same layer as that of the intermediate insulating film, and a gate electrode formed on the gate insulating film.

6 Claims, 27 Drawing Sheets

SEMICONDUCTOR DEVICE AND NONVOLATILE SEMICONDUCTOR MEMORY DEVICE COMPRISING A PLURALITY OF SEMICONDUCTOR ELEMENTS AS WELL AS PROCESS FOR THE SAME

BACKGROUND OF THE INVENTION

1. Field of the Invention

The present invention relates to a semiconductor device, a nonvolatile semiconductor memory device and process for the same, in particular, to a semiconductor device and a nonvolatile semiconductor memory device where it is possible to simplify the manufacturing processes thereof as well as those processes.

2. Description of the Background Art

Conventionally, a nonvolatile semiconductor memory device is known as one type of semiconductor devices. FIG. 15 is a schematic cross section view showing a conventional nonvolatile semiconductor memory device. Referring to FIG. 15, the conventional nonvolatile semiconductor memory device is described.

Referring to FIG. 15, the nonvolatile semiconductor memory device includes a memory cell region and a peripheral circuit region. In the memory cell region, shown in FIG. 15, a cross section view A showing a region where a plurality of memory cells are formed and a cross section view B which is a cross section view along the line B—B in the above cross section view A are shown. Cross section view A is a cross section view in the bit line direction (direction approximately parallel to the direction in which interconnections 125a to 125c extend) in the memory cell region. Cross section view B is a cross section view in the word line direction (direction approximately perpendicular to the direction in which a phosphorous doped polysilicon film 116a to 116d extends as control gate electrodes) in the memory cell region.

In the memory cell region, an n well 105 is formed in a region at a predetermined depth from the main surface of a semiconductor substrate 101. A p well 111a is formed in a region located above the n well 105 in the semiconductor substrate 101. An element isolation insulating film 102a, 102b are formed on the main surface of the semiconductor substrate 101. As is seen from cross section views A and B, n type diffusion regions 120a to 120c are formed in the main surface of the semiconductor substrate 101 at predetermined intervals in the direction perpendicular to the surface of the paper in cross section view A. A silicon oxide film 112 is formed on the main surface of the semiconductor substrate 101. A polysilicon film 113ab, 113bb, 113cb which become floating gate electrodes is formed on the silicon oxide film 112. This polysilicon film 113ab, 113bb, 113cb as floating gate electrodes is formed of a plurality of pieces arranged at intervals in the direction perpendicular to the surface of the paper in cross section view A. That is to say, as shown in cross section view B, the pieces of polysilicon film 113ba, 113bb, 113bc, 113bd are arranged at intervals with interstitial regions wherein the n type diffusion regions 120a to 120c are formed. A three layered insulating film 115a to 115d is formed as an intermediate insulating film on the polysilicon film 113ab, 113bb, 113cb, 113ba, 113bc, 113bd as the floating gate electrodes. This three layered insulating film 115a to 115d is formed of a three layered structure of a silicon oxide film, a silicon nitride film and a silicon oxide film. A phosphorous doped polysilicon film 116a to 116d as control gate electrodes are formed on the above three layered insulating film 115a to 115d. A tungsten silicide (WSi) film 117a to 117d is formed on the phosphorous doped polysilicon film 116a to 116d. A silicon oxide film 118a to 118d are formed on the tungsten silicide film 117a to 117d. A boron phosphorous glass 123 is formed on the silicon oxide film 118a to 118d. Contact holes 124a to 124c are formed by partially removing portions of the boron phosphorous glass 123 and the silicon oxide film 112 in the regions located above the n type diffusion regions 120a to 120c. At the bottom of these contact holes 124a to 124c, the surfaces of the n type diffusion regions 120a to 120c are exposed. Interconnections 125a to 125c made of a conductive material are formed so as to extend from the inside of these contact holes 124a to 124c to the upper surface of the boron phosphorous glass 123. As for the material for these interconnections 125a to 125c, an aluminum-silicon-copper (Al—Si—Cu) alloy film can be used.

In cross section view B, of the memory cell region, the n type diffusion region 120a and the n type diffusion region (not shown) located on the left side of the above n type diffusion region 120a work as the source region and the drain region of one flash memory cell. These n type diffusion regions, the silicon oxide film 112, which works as a tunnel insulating film, the phosphorous doped polysilicon film 113ba as a floating gate electrode, the three layered insulating film 115a and the phosphorous doped polysilicon film 116a as a control gate electrode form one flash memory cell. In addition, the n type diffusion regions 120a, 120b as the source and drain regions, the silicon oxide film 112 which works as a tunnel insulating film, the phosphorous doped polysilicon film 113bb as a floating gate electrode, the three layered insulating film 115b and the phosphorous doped polysilicon film 116b as a control gate electrode form another flash memory cell. In addition, the n type diffusion regions 120b, 120c as the source and drain regions, the silicon oxide film 112 which works as a tunnel insulating film, the phosphorous doped polysilicon film 113bc as a floating gate electrode, the three layered insulating film 115c and the phosphorous doped polysilicon film 116c as a control gate electrode form another flash memory cell. Furthermore, the n type diffusion region 120c and an n type diffusion region (not shown) arranged on the right side of the n type diffusion region 120c with an interval between them as the source and drain regions, the silicon oxide film 112 which works as a tunnel insulating film, the phosphorous doped polysilicon film 113bd as a floating gate electrode, the three layered insulating film 115d and the phosphorous doped polysilicon film 116d as a control gate electrode form still another flash memory cell. The flash memory cells are arranged in a matrix form in the memory cell region.

In the peripheral circuit region of the nonvolatile semiconductor memory device shown in FIG. 15, an n type field effect transistor (FET) 126 and a p type FET 127 are formed. In the peripheral circuit region, an element isolation insulating film 102c is formed on the main surface of the semiconductor substrate 101. In the element formation region isolated by this element isolation insulating film 102c, a p well 111b is formed in the main surface of the semiconductor substrate 101 in the region where the n type FET 126 is formed. Then type diffusion regions 121a and 121b which become the source and drain regions of the n type FET 126 are formed with a channel region between them in the main surface of the semiconductor substrate 101 in this p well 111b. A silicon oxide film 129 is formed as a gate insulating film on the main surface of the semiconductor substrate 101. A phosphorous doped polysilicon film 116e is formed on the silicon oxide film 129 as a gate electrode in the region above the channel region located between the n type diffusion regions 121a and 121b which become the source and drain regions. A tungsten silicide film 117e is formed on the phosphorous doped polysilicon film 116e. A silicon oxide film 118e is formed on the tungsten silicide film 117e.

In the region wherein the p type FET 127 is formed in the peripheral circuit region, an n well 108 is formed in the semiconductor substrate 101. P type diffusion regions 122a and 122b, which become the source and drain regions, are formed so as to face each other via a channel region in the main surface of the semiconductor substrate 101 in the above n well 108. A silicon oxide film 129 which becomes a gate insulating film is formed on the main surface of the semiconductor substrate 101. In the region which is located above the channel region and on the silicon oxide film 129, a phosphorous doped polysilicon film 116f is formed as a gate electrode. A tungsten silicide film 117f is formed on the phosphorous doped polysilicon film 116f. A silicon oxide film 118f is formed on the tungsten silicide film 117f.

A boron phosphorous glass 123 is formed on the silicon oxide film 118e, 118f. Contact holes 124d to 124g are formed by partially removing the boron phosphorous glass 123 and the silicon oxide film 129 in the regions located above the n type diffusion regions 121a, 121b and the p type diffusion regions 122a, 122b. At the bottom of the contact holes 124d to 124g, respectively, the surface of the n type diffusion regions 121a, 121b and the p type diffusion regions 122a, 122b is exposed. Interconnections 125d to 125g made of a conductive film are formed so as to extend from the inside of the contact holes 124d to 124g to the upper surface of the boron phosphorous glass 123. As for the material of these interconnections 125d to 125g, an aluminum-silicon-copper (Al—Si—Cu) alloy film can be used.

FIGS. 16 to 27 are schematic cross section views for describing a manufacturing process of the conventional nonvolatile semiconductor memory device shown in FIG. 15. Referring to FIGS. 16 to 27, the manufacturing process of the conventional nonvolatile semiconductor memory device shown in FIG. 15 is described.

Here in FIGS. 16 to 27, basically the same cross sections as in FIG. 1 are shown. That is to say, cross section views positioned left side in FIGS. 2 to 8 and 10 to 14 show cross sections in the bit line direction of the memory cells while cross section views located in the middle show cross section views in the word line direction of the memory cells.

Firstly, as shown in FIG. 16, an element isolation insulating film 102a to 102c is formed in the region which becomes the memory cell region and in the region which becomes the peripheral circuit region in the main surface of a semiconductor substrate 101 which is a p type silicon substrate with the growth direction of <100>.

Next, a resist (not shown) is applied to the main surface of the semiconductor substrate 101. The resist lying above the memory cell region is removed through a photolithographic method. As a result, a resist film exists in the peripheral circuit region while the memory cell region converts to the condition wherein the main surface of the semiconductor substrate 101 is exposed. Then, phosphorous is injected (doped) into the semiconductor substrate 101 in the memory cell region by using the above resist film as a mask. An n well 105 (see FIG. 17) as the bottom well is formed through this phosphorous injection. As for the phosphorous injection conditions at this time, the conditions where the injection energy is 3 MeV and the injection concentration of phosphorous is $1.0 \times 10^{13}/cm^2$ can be used. After this, the resist film is removed.

Next, a resist is applied to the main surface of the semiconductor substrate 101. Then, a resist film is formed above the memory cell region and above the regions where the n type FET 126 (see FIG. 15) is formed in the peripheral circuit region through a photolithographic method. At this time, in the region where the p type FET 127 (see FIG. 15) is formed in the peripheral circuit region, the main surface of the semiconductor substrate 101 is in an exposed condition. Then, phosphorous is injected into the semiconductor substrate 101 by using this resist film as a mask. An n well 108 is formed as shown in FIG. 17 through this phosphorous injection. As for the conditions of this phosphorous injection, the conditions where, for example, the injection energy is 1.2 MeV, the injection concentration of phosphorous is $1.0 \times 10^{13}/cm^2$, and the like, can be used. In addition, following this phosphorous injection, phosphorous is injected to the semiconductor substrate 101 for a channel cut. As for the condition of the phosphorous injection for this channel cut, the conditions where, for example, the injection energy is 700 keV, the injection concentration is $3.0 \times 10^{12}/cm^2$, and the like, can be used. In addition, boron may be injected into the semiconductor substrate 101 for counter doping. As for the boron injection conditions for this counter dopant, the conditions where, for example, the injection energy is 20 keV, the injection concentration is $1.5 \times 10^{12}/cm^2$, and the like, can be used. After this, the resist film is removed.

Next, after applying the resist to the main surface of the semiconductor substrate 101, a resist film 109 is formed on the region where the p type FET 127 is formed in the peripheral circuit region as shown in FIG. 17 through a photolithographic method. At this time, in the memory cell region and in the region where an n type FET 126 is formed in the peripheral circuit region, the main surface of the semiconductor substrate 101 is in an exposed condition. Then, by injecting boron 110 into the semiconductor substrate 101 using the resist film 109 as a mask, p wells 111a, 111b (see FIG. 18) are formed. As for the conditions of this boron injection, the conditions where, for example, the injection energy is 700 ke V, the injection concentration is $1.0 \times 10^{13}/cm^2$, and the like, can be used. In addition, boron for p channel cut may then be injected into the semiconductor substrate 101. As for the boron injection conditions for this p channel cut, the conditions where, for example, the injection energy is 270 keV, the injection concentration is $3.5 \times 10^{12}/cm^2$, and the like, can be used. In addition, boron for channel doping may further be injected into the semiconductor substrate 101. As for the boron injection conditions for this channel doping, the conditions where, for example, the injection energy is 50 keV, the injection concentration is $1.2 \times 10^{12}/cm^2$, and the like, can be used. After that, the resist film 109 is removed.

Next, as shown in FIG. 18, a silicon oxide film 112 is formed on the main surface of the semiconductor substrate 101 by using a thermal oxidation method. The film thickness of this silicon oxide film 112 is 10 nm. This silicon oxide film 112 works as a tunnel oxide film of a flash memory cell formed in the memory cell region.

Then, a phosphorous doped polysilicon film is formed on this silicon oxide film 112. This phosphorous doped polysilicon film can be formed by using a low pressure CVD (chemical vapor deposition) method. In addition, the film thickness of this phosphorous doped polysilicon film is 100 nm. A resist is applied to this phosphorous doped polysilicon film. Then, a resist film is formed on the phosphorous doped polysilicon film in the memory cell region and in the peripheral circuit region through a photolithographic method. By partially removing the phosphorous doped polysilicon film through etching using this resist film as a mask, the phosphorous doped polysilicon film 113a to 113c and 113 which has a predetermined pattern is formed as shown in FIG. 18. In this etching process, since the resist film is formed in the peripheral circuit region, the phosphorous doped polysilicon film 113 in the peripheral circuit region remains unchanged without being etched. After this, the resist film is removed. In this manner, the structure as shown in FIG. 18 is gained.

Next, a silicon oxide film is formed on the phosphorous doped polysilicon film 113a to 113c in the memory cell region and on the phosphorous doped polysilicon film in the peripheral circuit region by using a thermal oxidation method. The film thickness of this silicon oxide film is, for example, 5 nm. Next, a silicon nitride film is formed on this silicon oxide film by using a low pressure CVD method. The film thickness of the silicon nitride film can be made, for example, to be approximately 10 nm. Then, a silicon oxide film is formed on this silicon nitride film by using a low pressure VCD method. The film thickness of this silicon oxide film can be made, for example, to be approximately 5 nm. In this manner, a three layered insulating film made of a silicon oxide film, a silicon nitride film and a silicon oxide film is formed. As a result of this, the structure as shown in FIG. 19 is gained.

Next, a resist is applied to the three layered insulating film 115. Then, a resist film 128 is formed on the three layered insulating film 115 in the memory cell region through a photolithographic method. At this time, since the resist is removed from the peripheral circuit region, the three layered insulating film 115 is exposed in the peripheral circuit region. In this manner, the structure as shown in FIG. 20 is gained.

Next, the three layered insulating film 115 in the peripheral circuit region, the phosphorous doped polysilicon film 113 and the silicon oxide film 112 are removed through etching by using the resist film 128 as a mask. After that, the resist film 128 is removed. In this manner, the structure as shown in FIG. 21 is gained.

Next, as shown in FIG. 22, a silicon oxide film 129 is formed on the main surface of the semiconductor substrate 101 in the peripheral circuit region by using a thermal oxidation method. The film thickness of this silicon oxide film 129 is 15 nm. Here, in this thermal oxidation method, since a silicon nitride film forming the three layered insulating film 115 exists in the memory cell region, the phosphorous doped polysilicon film 113a to 113c located beneath this three layered insulating film 115 is not oxidized.

Next, as shown in FIG. 23, a phosphorous doped polysilicon film 116 is formed on the three layered insulating film 115 and on the silicon oxide film 129 both in the memory cell region as well as in the peripheral circuit region. This phosphorous doped polysilicon film 116 is formed by using a low pressure CVD method. In addition, the film thickness of this phosphorous doped polysilicon film 116 is 200 nm. A tungsten silicide film 117 is formed on this phosphorous doped polysilicon film 116. The film thickness of this tungsten silicide film 117 is 200 nm. Then, a silicon oxide film 118 is, further, formed on the tungsten silicide film 117.

Next, a resist film (not shown) which has a predetermined pattern is formed on the silicon oxide film 118 by using a photolithographic method. By partially removing the silicon oxide film 118 using this resist film as a mask, a silicon oxide film 118a to 118f (see FIG. 24) is formed. After that, the resist film is removed. Then, by partially removing the tungsten suicide (WSi) film 117 through etching using this silicon oxide film 118a to 118f as a mask, the tungsten silicide film 117a to 117f (see FIG. 24) is formed.

Then, by partially removing the phosphorous doped polysilicon film 116 using this silicon oxide film 118a to 118f as a mask, a phosphorous doped polysilicon film 116a to 116f is formed as shown in FIG. 24. The phosphorous doped polysilicon film 116a to 116d in the memory cell region functions as the control gate electrode of a flash memory cell. Then, the phosphorous doped polysilicon film 116e, 116f formed in the peripheral circuit region becomes the gate electrodes of the n type FET 126 and p type FET 127, respectively.

Next, a resist film 119 is formed, by using a photolithographic method, so as to cover the regions wherein the n type FET 126 and the p type FET 127 are to be formed in the peripheral circuit region. Under this condition, the three layered insulating film 115 and the phosphorous doped polysilicon film 113a to 113c are partially removed by using the silicon oxide film 118a to 118d as a mask in the memory cell region. In this manner, the structure as shown in FIG. 25 is gained. Through this etching, as shown in FIG. 25, a phosphorous doped polysilicon film 113ba, 113bb, 113bc, 113bd is formed to function as floating gate electrodes which are arranged at intervals in the direction perpendicular to the direction in which the word lines of the flash memory cells extend (direction in which the phosphorous doped polysilicon film 116a to 116d extend as control gate electrodes). In addition, another phosphorous doped polysilicon film 113a, 113c shown in FIG. 24 is divided in the same manner in the direction approximately perpendicular to the direction in which the word lines extend so as to be a phosphorous doped polysilicon film 113ab, 113cb as shown in FIG. 25. That is to say, the phosphorous doped polysilicon film 113ab, 113cb, 113ba, 113bb, 113bc, 113bd as the floating gate electrodes are in the condition arranged in a matrix form on the semiconductor substrate 101.

Then, in the memory cell region, arsenic ions are injected to the semiconductor substrate 101 which is located beneath the region wherein the upper surface of the silicon oxide film 112 is exposed. As for the conditions of this arsenic ion injection, the conditions where, for example, the injection energy is 40 keV and the injection concentration is $2.0 \times 10^{15}/cm^2$ can be used. After that, a heat treatment is carried out by maintaining the semiconductor substrate 101 in a nitrogen atmosphere at a predetermined temperature. As for the conditions of this heat treatment, the conditions where the atmospheric temperature is 850° C., heating time is 30 minutes, and the like, can be used. Through such a heat treatment the arsenic ions are activated. As a result of this, n type diffusion regions 120a to 120c are formed in the main surface of the semiconductor substrate 101 as shown in FIG. 26. In this manner, the structure as shown in FIG. 26 can be gained. After that, the resist film 119 is removed.

Next, a resist film (not shown) is formed, by using a photolithographic method, in a region other than the region where the n type FET 126 is to be formed. Under the condition where this resist film exists, arsenic ions are injected into the main surface of the semiconductor substrate 101 in the peripheral circuit region. As for the injection conditions, the conditions where the injection energy is 50 keV and the injection concentration is $3.0 \times 10^{15}/cm^2$ can be used. After that, the resist film is removed. In addition, a resist film is formed in a region other than the region where the p type FET 127 is to be formed. Then, by using this resist film as a mask, BF$_2$ ions are injected into the main surface of the semiconductor substrate 101 in the region where the p type FET 127 is to be formed. As for the conditions for this injection, the injection energy is 30 keV and the injection concentration is 3.0×10$^{15}$/cm$^2$.

After that, the semiconductor substrate 101 undergoes heat treatment. As for the conditions for this heat treatment, the atmospheric temperature is 800° C. and the substrate is maintained at this temperature for 30 min. Through this heat treatment, conductive impurities such as arsenic ions injected into the semiconductor substrate 101 in the peripheral circuit region are activated. As a result of this, n type diffusion regions 121a, 121b and p type diffusion regions 122a, 122b are formed. In this manner, the structure as shown in FIG. 27 is gained.

Next, boron phosphorous glass 123 (see FIG. 15) is formed on the silicon oxide film 118a to 118f by using a CVD method. The film thickness of this boron phosphorous glass 123 is 1000 nm. Then, by heat treating the semiconductor substrate 101, the boron phosphorous glass 123 is hardened. As for the conditions of this heat treatment, a nitrogen atmosphere is used as the atmosphere, the heating temperature is 850° C. and the heating time is 30 min. A resist film (not shown) is formed on this boron phosphorous glass 123 by using a photolithographic method. By using this resist film as a mask, the boron phosphorous glass 123 and the silicon oxide film 112, 129 are partially removed through etching. In this manner, contact holes 124a to 124g (see FIG. 15) are created. After this, the resist film is removed. Then, by using a sputtering method, an aluminum-silicon-copper (Al—Si—Cu) alloy film is formed as a conductive film which extends from the inside of the contact holes 124a to 124g to the upper surface of the boron phosphorous glass 123. A resist film with an interconnection pattern is formed on this alloy film by using a photolithographic method. By using this resist film as a mask, the alloy film is partially removed through etching. After that, the resist film is removed. In this manner, interconnections 125a to 125g are formed as shown in FIG. 15.

In this manner, the conventional nonvolatile semiconductor memory device is produced.

In the above described nonvolatile semiconductor memory device according to the prior art, however, the below described problems arise. That is to say, a flash memory cell formed in the memory cell region has a so-called stacked gate structure wherein a floating gate electrode and a control electrode are layered. On the other hand, the n type FET 126 and the p type FET 127 in the peripheral circuit region are conventional field effect transistors, of which the gate electrodes do not have a stacked gate structure. Therefore, the silicon oxide film 112 as a tunnel insulating film in the memory cell region, the three layered insulating film 115 located on the phosphorous doped polysilicon film 113ab, 113bc, 113cb, 113ba, 113bc, 113bd and the silicon oxide film 129 as a gate insulating film formed in the peripheral circuit region are, respectively, formed through different process steps. As a result of this, the number of process steps of the nonvolatile semiconductor memory device increases leading to an increase in the manufacturing cost of the nonvolatile semiconductor memory device. Accordingly, the reduction of the manufacturing cost of semiconductor devices, such as a nonvolatile semiconductor memory device of which the manufacturing cost is relatively high, has become a particularly important problem to solve.

In addition, a current of a comparatively high voltage is necessary in order to carry out a write in operation, an erase operation, or the like, on a flash memory cell formed in the memory cell region. Therefore, the n type FET 126 and the p type FET 127 formed in the peripheral circuit region need to control a current of such a high voltage. Accordingly, a high level of dielectric strength is required for the silicon oxide film 129, which works as the gate insulating film of the n type FET 126, as well as for the p type FET 127, which are semiconductor elements in the peripheral circuit region, in order to control a current of such a high voltage.

SUMMARY OF THE INVENTION

The object of the present invention is to provide a semiconductor device and a nonvolatile semiconductor memory device of which the manufacturing processes are simplified so that the manufacturing costs can be reduced and at the same time, which have semiconductor elements that can control a high voltage as well as to provide the processes for the same.

A semiconductor device according to one aspect of this invention is a semiconductor device which has the first and the second semiconductor elements wherein the first semiconductor element includes a lower layer electrode formed on the substrate, an intermediate insulating film formed on the lower layer electrode and an upper electrode formed on the insulating film. The second semiconductor element includes a gate insulating film which is formed on the substrate and which is formed of the same layer as the intermediate insulating film and a gate electrode formed on the gate insulating film.

In this manner, as is made clear in the description of the process below, the intermediate insulating film of the first semiconductor element and the gate insulating film of the second semiconductor element can be formed in the same steps. Accordingly, the process of the semiconductor device can be simplified than in the case wherein the intermediate insulating film in the first semiconductor device and the gate insulating film in the second semiconductor element are formed in different steps. As a result of this, the manufacturing cost of the semiconductor device can be reduced.

In addition, by making the thickness of the insulating film, which forms the gate insulating film, sufficiently great, the dielectric strength of the gate insulating film can easily be increased. As a result of this, it becomes possible to control a comparatively high voltage in the second semiconductor element.

In the semiconductor device according to the above described aspect, the first semiconductor element may further include a lower insulating film which is formed beneath the lower electrode. The intermediate insulating film and the gate insulating film may have the film thickness larger than that of the lower insulating film.

In this case, the present invention can be easily applied to a nonvolatile semiconductor memory device such as a flash memory wherein it is necessary to arrange an insulating film of a comparatively thin film thickness as the lower insulating film. Then, in such a nonvolatile semiconductor memory device, it is necessary to control a high voltage in order to carry out the operations such as write in, erasing, or the like, of a memory cell. Therefore, by making the film thickness of the gate insulating film sufficiently large, the second semiconductor element can be effectively utilized as a semiconductor element for controlling such a high voltage.

In the semiconductor device according to the above described aspect, the intermediate insulating film and the gate insulating film may be formed of a plurality of insulating film parts.

In this case, it becomes possible to make the intermediate insulating film and the gate insulating film to have a multilayered structure wherein, for example, insulating film parts made of different materials are layered. Accordingly, by changing the material quality and the thickness of these insulating film parts, it becomes possible to arbitrarily change the electrical characteristics of the first and the second semiconductor elements. That is to say, it becomes possible to expand the scope of the electrical characteristics implemented in the first and the second semiconductor elements.

In the semiconductor device according to the above described aspect, the plurality of insulating film parts may include an oxide film, a nitride film arranged on this oxide film and an upper oxide film arranged on the nitride film.

In this case, the intermediate insulating film and the gate insulating film has a three layered structure of an oxide film, a nitride film and an upper oxide film. As a result of this, the dielectric strength of the gate insulating film can be increased without fail.

A nonvolatile semiconductor memory device according to another aspect of this invention is a nonvolatile semiconductor memory device comprising memory elements and peripheral circuit elements, wherein a memory element includes a floating gate electrode formed on the substrate, an intermediate insulating film formed on the floating gate electrode and a control gate electrode formed on the intermediate insulating film. Furthermore, a peripheral circuit element includes a gate insulating film, which is formed on the substrate and which is formed of the same layer as the intermediate insulating film, as well as a gate electrode formed on the gate insulating film.

In this manner, in the process of the nonvolatile semiconductor memory device, the intermediate insulating film of the memory elements and the gate insulating film of the peripheral circuit elements can be formed in the same steps. Accordingly, the process of the nonvolatile semiconductor memory device can be simplified in comparison with the case where the intermediate insulating film of the memory elements and the gate insulating film of the peripheral circuit elements are formed in separate steps. As a result of this, the manufacturing cost of the nonvolatile semiconductor memory device can be reduced.

In addition, by making the thickness of the gate insulating film sufficiently large, the isolation withstanding of the gate insulating film can easily be made larger. As a result of this, it becomes possible to control a comparatively high voltage in the peripheral circuit elements.

In the above described nonvolatile semiconductor memory device according to another aspect, the memory elements may further includes a tunnel insulating film formed below the floating gate electrode. The intermediate insulating film and the gate insulating film may have the film thickness larger than that of the tunnel insulating film.

In this case, the present invention can easily be applied to a flash memory, or the like, wherein it is necessary to arrange an insulating film of a comparatively thin film thickness as a tunnel insulating film. Then, in a nonvolatile semiconductor memory device such as the flash memory herein, it is necessary to control a current of a high voltage in order to carry out operations such as write in, erasing and the like of the memory cells. Then, by making the film thickness of the gate insulating film sufficiently large, the peripheral circuit elements which control such a high voltage can be easily implemented.

In the above described nonvolatile semiconductor memory device according to another aspect, the intermediate insulating film and the gate insulating film may be formed of a plurality of insulating film parts.

In this case, it becomes possible to make the intermediate insulating film and the gate insulating film to have a multilayered structure wherein, for example, insulating film parts made of different materials are layered. Accordingly, by changing the material quality and the thickness of these insulating film parts, it becomes possible to arbitrarily change the electrical characteristics of the memory elements and the peripheral circuit elements. That is to say, it becomes possible to expand the scope of the electrical characteristics implemented in the memory elements and the peripheral circuit elements in the nonvolatile semiconductor memory device.

In the above described nonvolatile semiconductor memory device according to another aspect, the plurality of insulating film parts may include an oxide film, a nitride film arranged on the oxide film and an upper oxide film arranged on the nitride film.

In this case, the intermediate insulating film and the gate insulating film has a three layered structure of an oxide film, a nitride film and an upper oxide film. As a result of this, the dielectric strength of the gate insulating film can be increased without fail. Accordingly, a peripheral circuit element which can control a current of a high voltage can be easily formed.

A process for a semiconductor device according to still another aspect of this invention is a process for a semiconductor device including the first and the second semiconductor elements, which includes the step of forming a lower electrode in the region where the first semiconductor elements are to be formed among the regions where the first and the second semiconductor elements are to be formed in the substrate, the step of forming an insulating film which extends from the lower electrode in the region where the first semiconductor elements are to be formed to the substrate in the region where the second semiconductor elements are to be formed, the step of forming a conductive film on the insulating film, the step of forming a resist film on the conductive film and the step of forming an upper electrode located on the insulating film in the region wherein the first semiconductor elements are to be formed and of forming a gate electrode located on the insulating film in the region wherein the second semiconductor elements are to be formed by partially removing the conductive film through etching by using the resist film as a mask.

In this manner, the intermediate insulating film located between the lower electrodes and the upper electrodes of the first semiconductor elements and the gate insulating film located below the gate electrodes of the second semiconductor elements can be formed of the above described insulating film. That is to say, the intermediate insulating film and the gate insulating film can be formed at the same time. Accordingly, a simplification of the process can be achieved in comparison with the case wherein the intermediate insulating film and the gate insulating film are formed in different steps, according to the prior art.

The above described process for a semiconductor device according to still another aspect may include the step of forming a lower insulating film which is located beneath the lower electrode in the region wherein the first semiconductor elements are to be formed and which has the film thickness thinner than the insulating film.

In this case, the present invention can be easily applied to a process for a nonvolatile semiconductor memory device such as a flash memory wherein it is necessary to provide an insulating film of a comparatively thin film thickness as a lower insulating film.

In the above described process for a semiconductor device according to still another aspect, the step of forming an insulating film may include the step of forming a first insulating film which extends from the lower electrode in the region wherein the first elements are to be formed to the substrate in the region wherein the second semiconductor elements are to be formed as well as the step of forming a second insulating film on the first insulating film.

In this case, it becomes possible to make the insulating film, which becomes the intermediate insulating film of the first semiconductor elements and the gate insulating film of the second semiconductor elements, have a multilayered structure wherein, for example, the first and the second insulating films made of different materials are layered. Accordingly, by changing the material quality or the thickness of these first and second insulating films, it becomes possible to arbitrarily change the electrical characteristics of the first and the second semiconductor elements.

In the above described process for a semiconductor device according to still another aspect, the first insulating film may be an oxide film while the second insulating film may be a nitride film. In addition, the step of forming the insulating film may further includes the step of forming an upper oxide film on the nitride film.

In this case, the intermediate insulating film and the gate insulating film have a three layered structure of an oxide film, a nitride film and an upper oxide film. As a result of this, the isolation withstanding of the gate insulating film can be increased without fail.

A process for a nonvolatile semiconductor memory device according to yet another aspect of this invention uses the above described process for a semiconductor device according to still another aspect.

Here, in a nonvolatile semiconductor memory device such as a flash memory, it is necessary to form memory elements and peripheral circuit elements for controlling these memory elements. Then, in a conventional process for such a nonvolatile semiconductor memory device, the gate insulating film of the peripheral circuit elements and the insulating film of the memory elements are formed in different steps. By applying a process for a semiconductor device according to the present invention, however, the memory elements correspond to the first semiconductor elements while the peripheral circuit elements correspond to the second semiconductor elements so that the insulating film located on the lower electrode of the memory elements and the gate insulating film of the peripheral circuit elements are formed at the same time as the same layer and, thereby, the process can be simplified.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
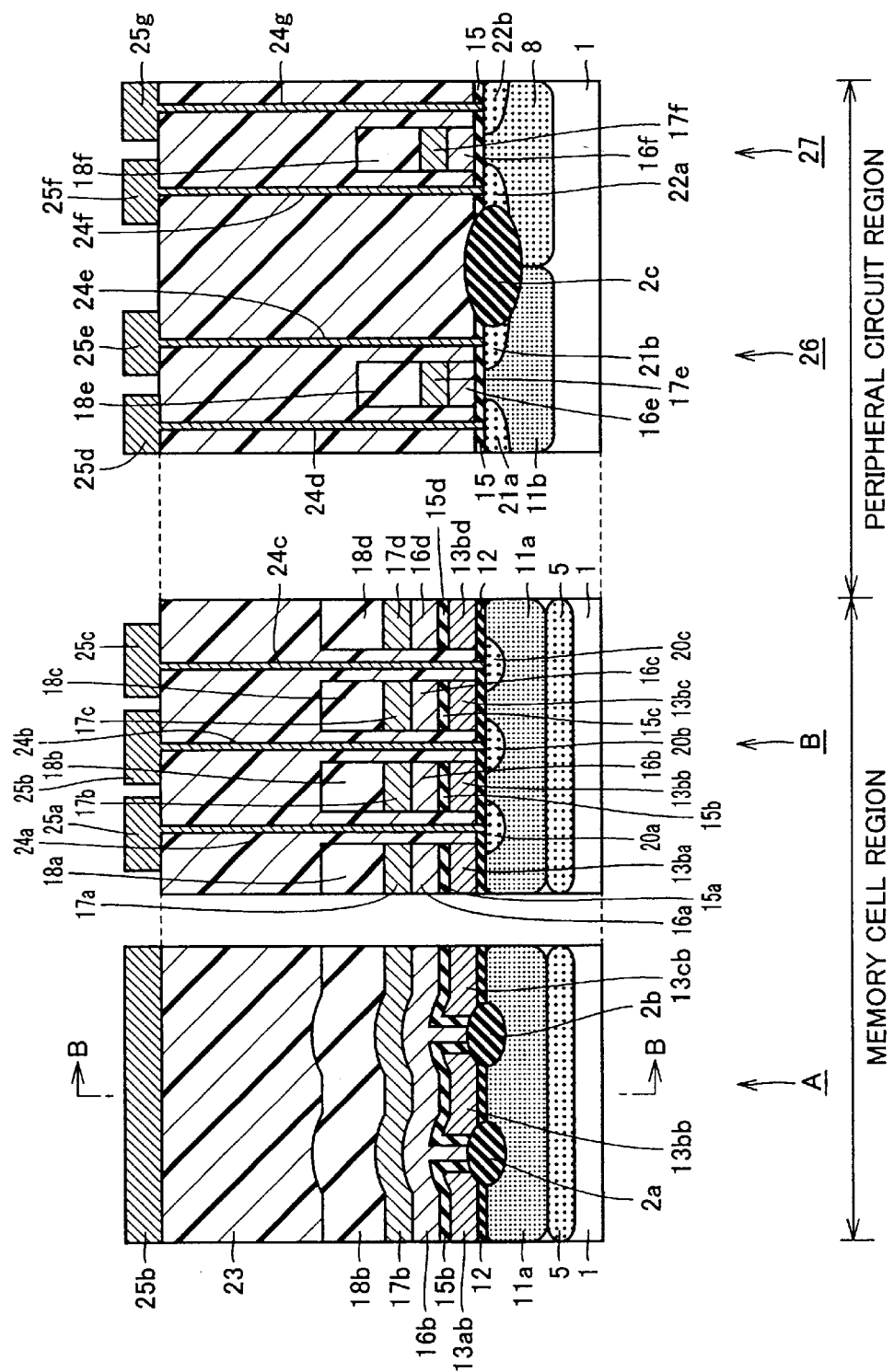
FIG. 1 is a schematic cross section view showing a nonvolatile semiconductor memory device as a semiconductor device according to the present invention.

In the following, embodiments of the present invention are described referring to the drawings. Here, in the following drawings, the same or the corresponding parts are referred to by the same reference numerals, of which the descriptions are not repeated.

Referring to FIG. 1, a nonvolatile semiconductor memory device according to the present invention is described.

Referring to FIG. 1, the nonvolatile semiconductor memory device is a flash memory, which includes a memory cell region and a peripheral circuit region. In the memory cell region shown in FIG. 1, cross section view A shows a region wherein a plurality of memory cells are formed and cross section view B shows a cross section view along the line B—B in this cross section view A. Cross section view A is a cross section view in the bit line direction (direction approximately parallel to the direction in which interconnections 25a to 25c extend) in the memory cell region. Cross section view B is a cross section view in the word line direction (direction approximately perpendicular to the direction in which phosphorous doped polysilicon film 16a to 16d extends as control gate electrodes) in the memory cell region.

In the memory cell region, an n well 5 is formed in a region at a predetermined depth from the main surface of a semiconductor substrate 1. A p well 11a is formed in a region located above this n well 5. An element isolation insulating film 2a, 2b is formed on the main surface of the semiconductor substrate 1. As can be seen from cross section views A and B, n type diffusion regions 20a to 20c are formed at predetermined intervals in the direction perpendicular to the surface of the paper of cross section view A in the main surface of the semiconductor substrate 1. A silicon oxide film 12 is formed on the main surface of the semiconductor substrate 1. A phosphorous doped polysilicon film 13ab, 13bb, 13cb, which becomes floating gate electrodes, is formed on the silicon oxide film. These pieces of phosphorous doped polysilicon film 13ab, 13bb, 13cb, which serve as the floating gate electrodes, are arranged in a plural number at intervals in the direction perpendicular to the surface of the paper in cross section view A. That is to say, as shown in cross section view B, the pieces of the phosphorous doped polysilicon film 13ba, 13bb, 13bc, 13bd are arranged at intervals with interstitial regions wherein the n type diffusion regions 20a to 20c are formed. In addition, as for the phosphorous doped polysilicon film 13ab, 13cb, a plurality of pieces of the phosphorous doped polysilicon film are arranged so as to adjoin in the direction perpendicular to the surface of the paper of cross section view A in the same manner.

A three layered insulating film 15a to 15d as an intermediate insulating film is formed on this phosphorous doped polysilicon film 13ab, 13bb, 13cb, 13ba, 13bc, 13bd. This three layered insulating film 15a to 15d is made of a three layered structure of a silicon oxide film, a silicon nitride film and a silicon oxide film. A phosphorous doped polysilicon film 16a to 16d as control gate electrodes is formed on this three layered insulating film 15a to 15d. A tungsten silicide film 17a to 17d is formed on the phosphorous doped polysilicon film 16a to 16d.

A silicon oxide film 18a to 18d is formed on the tungsten silicide film 17a to 17d. Boron phosphorous glass 23 is formed on the silicon oxide film 18a to 18d. By partially removing parts of the boron phosphorous glass 23 and the silicon oxide film 12, contact holes 24a to 24c are created. At the bottoms of these contact holes 24a to 24c parts of the surfaces of the n type diffusion regions 20a to 20c are exposed. Interconnections 25a to 25c made of a conductor is formed so as to extend from the inside of these contact holes 24a to 24c to the upper surface of the boron phosphorous glass 23. As for the material of these interconnections 25a to 25c, an aluminum-silicon-copper (Al—Si—Cu) alloy film can be used.

In cross section view B of the memory cell region, the n type diffusion region 20a and an n type diffusion region (not shown) located on the left side of the above n type diffusion region 20a work as the source region and the drain region of one flash memory cell. These n type diffusion regions, the silicon oxide film 12 which works as a tunnel insulating film, the phosphorous doped polysilicon film 13ba as a floating gate electrode, the three layered insulating film 15a and the phosphorous doped polysilicon film 16a as a control gate electrode form one flash memory cell.

In addition, the n type diffusion regions 20a, 20b as the source and drain regions, the silicon oxide film 12 which works as a tunnel insulating film, the phosphorous doped polysilicon film 13bb as a floating gate electrode, the three layered insulating film 15b and the phosphorous doped polysilicon film 16b as a control gate electrode form another flash memory cell.

In addition, the n type diffusion regions 20b, 20c as the source and drain regions, the silicon oxide film 12 which works as a tunnel insulating film, the phosphorous doped polysilicon film 13bc as a floating gate electrode, the three layered insulating film 15c and the phosphorous doped polysilicon film 16c as a control gate electrode form still another flash memory cell.

Furthermore, the n type diffusion region 20c and an n type diffusion region (not shown) arranged on the right side of the n type diffusion region 120c with an interval between them as the source and drain regions, the silicon oxide film 12 which works as a tunnel insulating film, the phosphorous doped polysilicon film 13bd as a floating gate electrode, the three layered insulating film 15d and the phosphorous doped polysilicon film 16d as a control gate electrode form yet another flash memory cell. The flash memory cells are arranged in a matrix form in the memory cell region.

An n type field effect transistor (FET) 26 and a p type field effect transistor (FET) 27 are formed in the peripheral circuit region shown in FIG. 1. An element isolation insulating film 2c is formed on the main surface of the semiconductor substrate 1 in the peripheral circuit region. In an element formation region isolated by this element isolation insulating film 2c, a p well 11b is formed in the main surface of the semiconductor substrate 1 in the region wherein the n type FET 26 is formed. N type diffusion regions 21a and 21b which become the source and drain regions of the n type FET are formed in the main surface of the semiconductor substrate 1 in this p well 11b. A three layered insulating film 15 which becomes a gate insulating film is formed on the main surface of the semiconductor substrate 1. A phosphorous doped polysilicon film 16e which serves as a gate electrode is formed on this three layered insulating film 15 in a region above a channel region located between the n type diffusion regions 21a and 21b which become the source and drain regions. A tungsten silicide film 17e is formed on the phosphorous doped polysilicon film 16e. A silicon oxide film 18e is formed on the tungsten silicide film 17e.

An n well 8 is formed in the semiconductor substrate 1 in the region where the p type FET 27 is formed in the peripheral circuit region. P type diffusion regions 22a and 22b which serve as the source and drain regions are formed so as to oppose to each other via a channel region in the main surface of the semiconductor substrate 1 in the above n well 8. A three layered insulating film 15 is formed on the main surface of the semiconductor substrate 1. A phosphorous doped polysilicon film 16f which serves as a gate electrode is formed in a region above the channel region, which is located on the three layered insulating film 15. A tungsten silicide film 17f is formed on the phosphorous doped polysilicon film 16f. A silicon oxide film 18f is formed on the tungsten silicide film 17f.

Boron phosphorous glass 23 is formed on the silicon oxide film 18e, 18f. Contact holes 24d to 24g are formed in regions located above the n type diffusion regions 21a, 21b and the p type diffusion regions 22a, 22b by partially removing the boron phosphorous glass 23 and the three layered insulating film 15. At the bottoms of the contact holes 24d to 24g, parts of the surfaces of the n type diffusion regions 21a, 21b and the p type diffusion regions 22a, 22b are exposed, respectively. Interconnections 25d to 25g made of a conductive film are formed so as to extend from the inside of the contact holes 24d to 24g to the upper surface of the boron phosphorous glass 23. As for the material of these interconnections 25d to 25g, an aluminum-silicon-copper (Al—Si—Cu) alloy film can be used.

In this manner, in the below described process for a nonvolatile semiconductor memory device, the three layered insulating film 15 which serves as an intermediate insulating film of a flash memory cell which is a memory element and the three layered insulating film 15 which serves as a gate insulating film of the n type FET 26 and the p type FET 27 which are peripheral circuit elements can be formed in the same steps. Accordingly, the process for the nonvolatile semiconductor memory device can be simplified in comparison with the case where the intermediate insulating film located between the floating gate electrode and the control gate electrode of a flash memory cell and the gate insulating film of the n type FET 26 and the p type FET 27 are formed in different steps. As a result of this, the manufacturing cost of the nonvolatile semiconductor memory device can be reduced.

In addition, by making the thickness of the three layered insulating film 15 which serves as the gate insulating film of the n type FET 26 and the p type FET 27 be sufficiently great, the dielectric strength of the three layered insulating film 15 can easily be increased. As a result of this, it becomes possible to control a current of a comparatively high voltage in the n type FET 26 and the p type FET 27.

In addition, as described below, the thickness of the silicon oxide film 12 which serves as a tunnel insulating film is 10 nm and the thickness of the three layered insulating film 15 is approximately 20 nm. That is to say, the three layered insulating film 15 is thicker than the silicon oxide film 12. In this manner, by forming the gate insulating film of the n type FET 26 and the p type FET 27 in the peripheral circuit region of the same layer as that of the three layered insulating film 15, which is located between the floating gate electrode and the control gate electrode and which has a comparatively great film thickness, the n type FET 26 and the p type FET 27 can easily be implemented as peripheral circuit elements which can control a current of a high voltage.

In addition, the three layered insulating film 15 has a multilayered structure formed of three layers wherein a silicon oxide film 32 which serves as an insulating film part, a silicon nitride film 31 and a silicon oxide film 30 (see FIG. 9) are layered. Accordingly, the dielectric strength of the gate insulating film of the n type FET 26 and the p type FET 27 can be increased without fail. In addition, by changing the thickness of this silicon oxide film 32 or the like, it becomes possible to arbitrarily change the electrical characteristics of the memory elements and the peripheral circuit elements. That is to say, it becomes possible to expand the scope of the electrical characteristics which can be implemented in a nonvolatile semiconductor memory device. Here, the three layered insulating film 15 may be a multilayered film with two layers, four layers, or more, and the material which forms the three layered insulating film 15 may be a different material providing that it is dielectric.

Referring to FIGS. 2 to 14, the process for the nonvolatile semiconductor memory device according to the present invention shown in FIG. 1 is described. Here, in FIGS. 2 to 14, essentially the same cross section as in FIG. 1 is shown. That is to say, cross section views located on the left side in FIGS. 2 to 8 and FIGS. 10 to 14 show the cross section in the bit line direction of the memory cells while the cross section views located in the middle show the cross section view in the word line direction of the memory cells.

Figure 2:
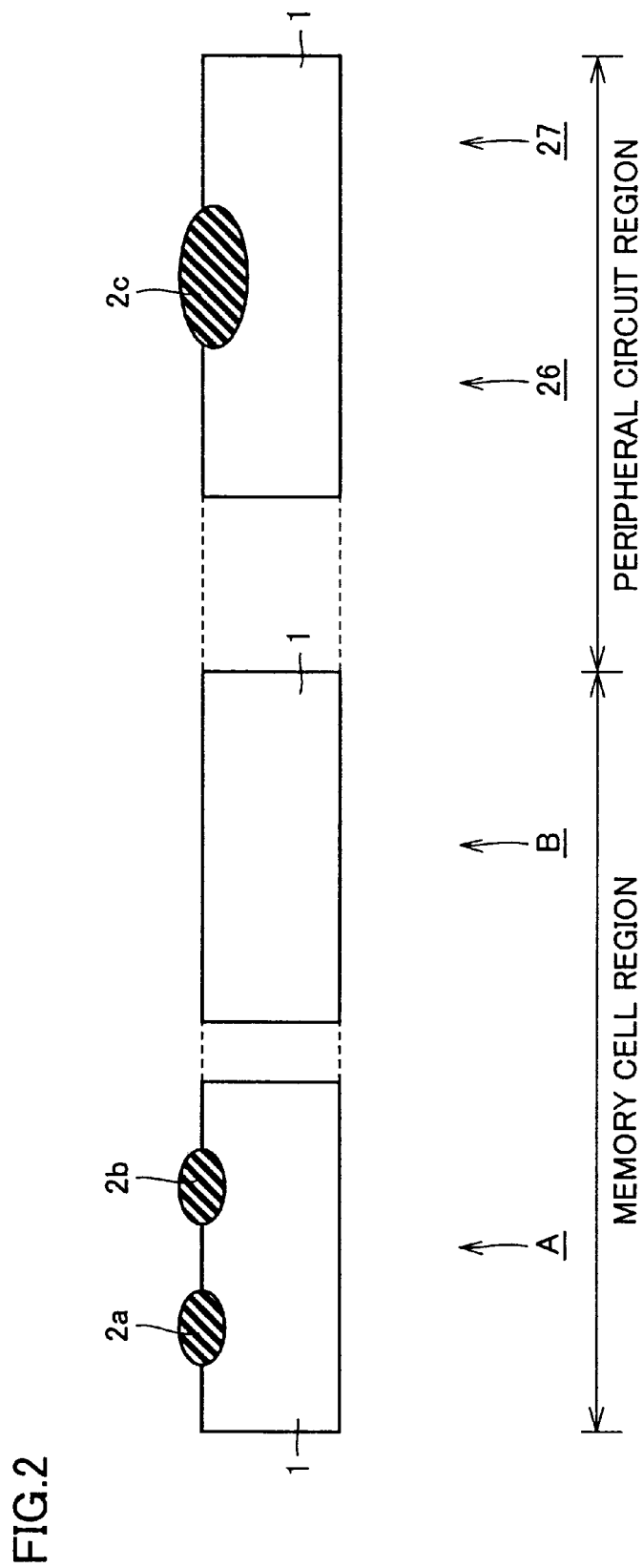
FIGS. 2 to 8 are schematic cross section views for describing the first to the seventh steps of a process of the nonvolatile semiconductor memory device shown in FIG. 1.

Firstly, as shown in FIG. 2, an element isolation insulating film 2*a* to 2*c* is formed on the main surface of a semiconductor substrate 1 which is a p type silicon substrate with the growth direction of <100> in a region which becomes a memory cell region as well as in a region which becomes a peripheral circuit region.

Figure 3:
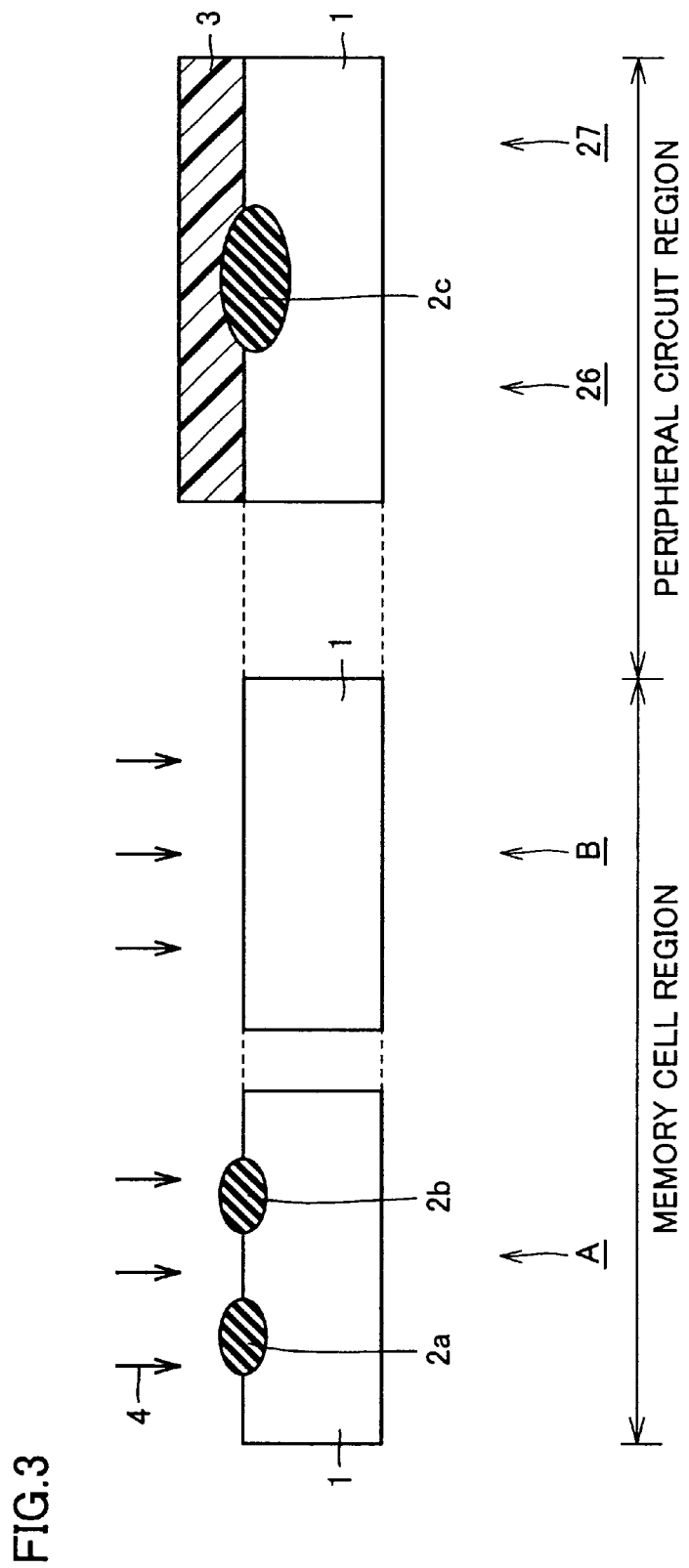

Next, a resist (not shown) is applied to the main surface of the semiconductor substrate 1. Then, the resist which exists above the memory cell region is removed through a photolithographic method. As a result, as shown in FIG. 3, the resist film 3 exists in the peripheral circuit region while the memory cell region is in the condition where the main surface of the semiconductor substrate 1 is exposed. Then, by using this resist film 3 as a mask, phosphorous 4 is injected as n type conductive impurities into the semiconductor substrate 1 in the memory cell region. An n well 5 (see FIG. 4) is formed as a bottom well through this injection of phosphorous 4. As for the injection conditions of phosphorous 4 at this time, the conditions where the injection energy is 3 MeV and the injection concentration is $1.0 \times 10^{13}/cm^2$ can be used. After this, the resist film 3 is removed.

Figure 4:
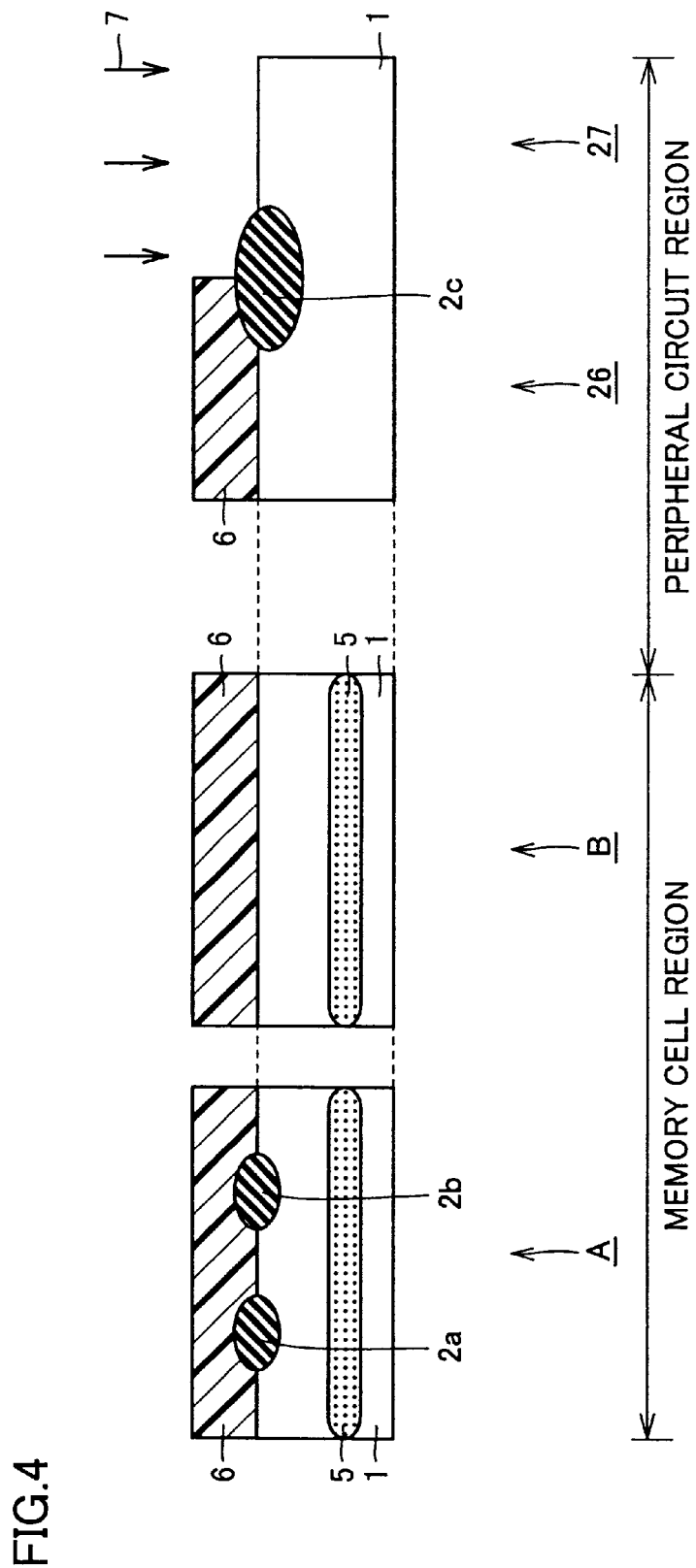

Next, a resist is applied to the main surface of the semiconductor substrate 1. Then, a resist film 6 is formed, through a photolithographic method, on the memory cell region as well as on the region wherein the n type FET 26 (see FIG. 1) is formed in the peripheral circuit region as shown in FIG. 4. At this time, the main surface of the semiconductor substrate 1 is in the exposed condition in the region wherein the p type FET 27 (see FIG. 1) is formed in the peripheral circuit region. Then, in order to form an n well 8 (see FIG. 5) as shown in FIG. 4, phosphorous 7 is injected as n type conductive impurities into the semiconductor substrate 1. As for this injection conditions of phosphorous 7, the conditions wherein, for example, the injection energy is 1.2 MeV and the injection concentration is $1.0 \times 10^{13}/cm^2$ can be used. In addition, subsequent to this injection of phosphorous 7, phosphorous is injected for a channel cut. As for the injection conditions of phosphorous for this channel cut, for example, the injection energy is 700 keV and the injection concentration is $3.0 \times 10^{12}/cm^2$. In addition, boron may be injected for counter doping. As for the conditions of this boron injection, as the counter dopant the injection energy is, for example, 20 keV and the injection concentration is $1.5 \times 10^{12}/cm^2$. After this, the resist film 6 is removed.

Figure 5:
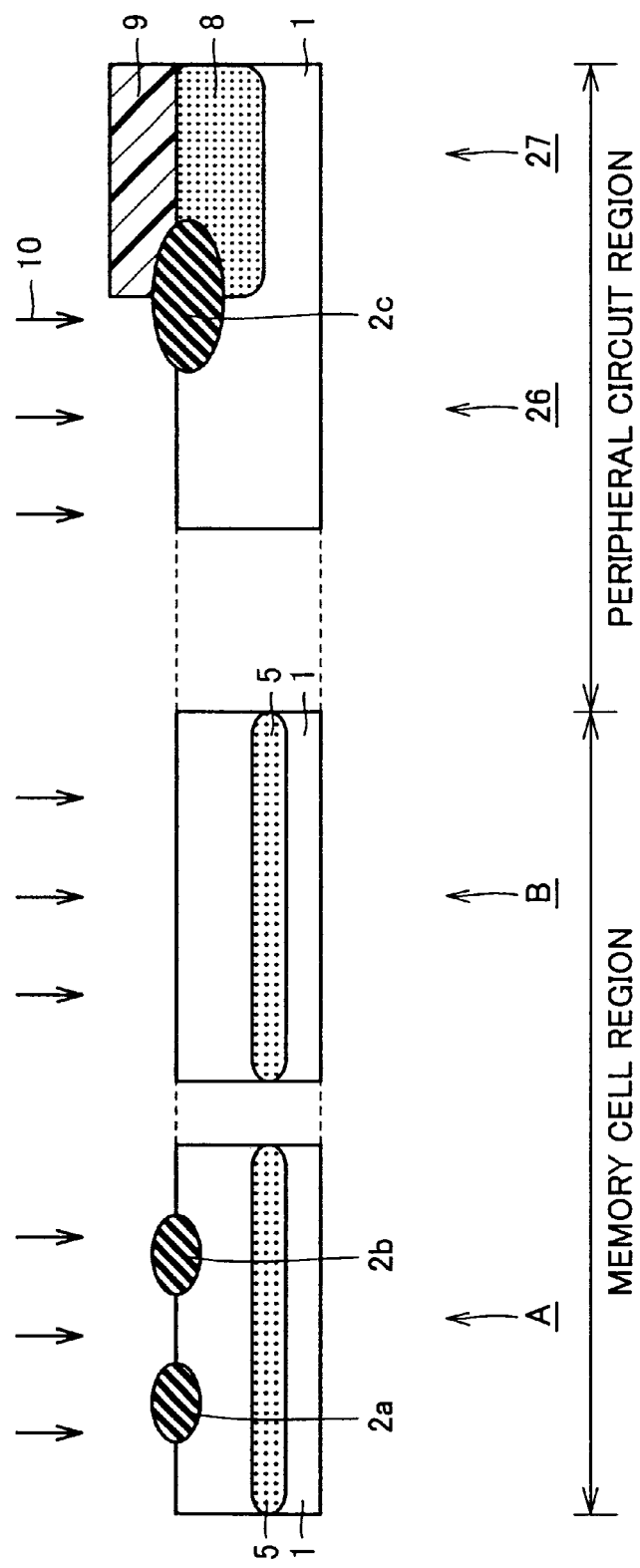

Next, After a resist is applied to the main surface of the semiconductor substrate 1, a resist film 9 is formed on the region wherein the p type FET 27 (see FIG. 1) is to be formed in the peripheral circuit region as shown in FIG. 5 by using a photolithographic method. At this time, the memory cell region and the region wherein the n type FET 26 is to be formed in the peripheral circuit region are in the condition where the main surface of the semiconductor substrate 1 is exposed. Then, by injecting boron 10 into the semiconductor substrate 1 using the resist film 9 as a mask, p wells 11*a* and 11*b* (see FIG. 6) are formed. As for the conditions for this boron injection the acceleration energy can be set at, for example, 700 keV and the injection concentration can be set at $1.0 \times 10^{13}/cm^2$. In addition, subsequently boron may be injected into the semiconductor substrate 1 for a p channel cut. As for the conditions for this boron injection for the p channel cut, the injection energy can be set at, for example, 270 keV and the injection concentration can be set at $3.5 \times 10^{12}/cm^2$. In addition, boron may further be injected into the semiconductor substrate 1 for channel doping. As for the conditions of this boron injection for channel doping, the injection energy can be set at, for example, 50 keV and the injection density can be set at $1.2 \times 10^{12}/cm^2$. After that, the resist film 9 is removed.

Figure 6:
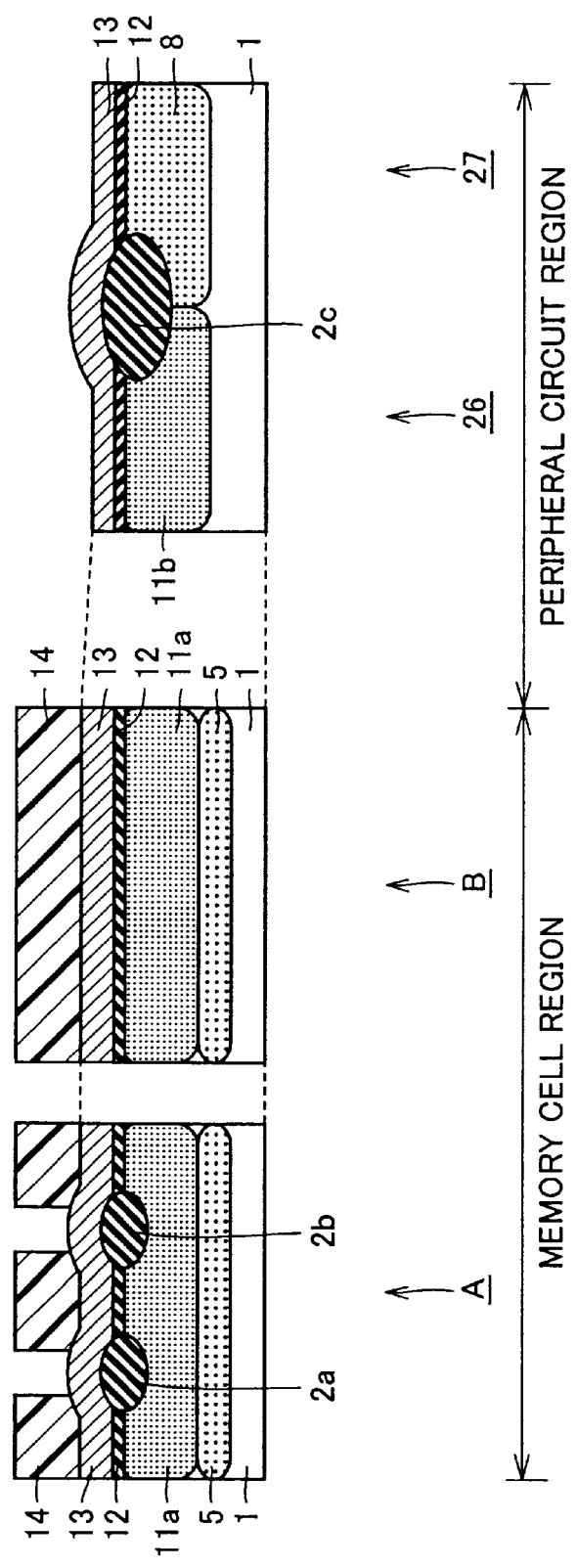

Next, as shown in FIG. 6, a silicon oxide film 12 is formed on the main surface of the semiconductor substrate 1 by using a thermal oxidation method. The film thickness of this silicon oxide film 12 is 10 nm. The silicon oxide film 12 in the memory cell region works as a tunnel oxide film of a flash memory cell formed in the memory cell region.

Figure 7:
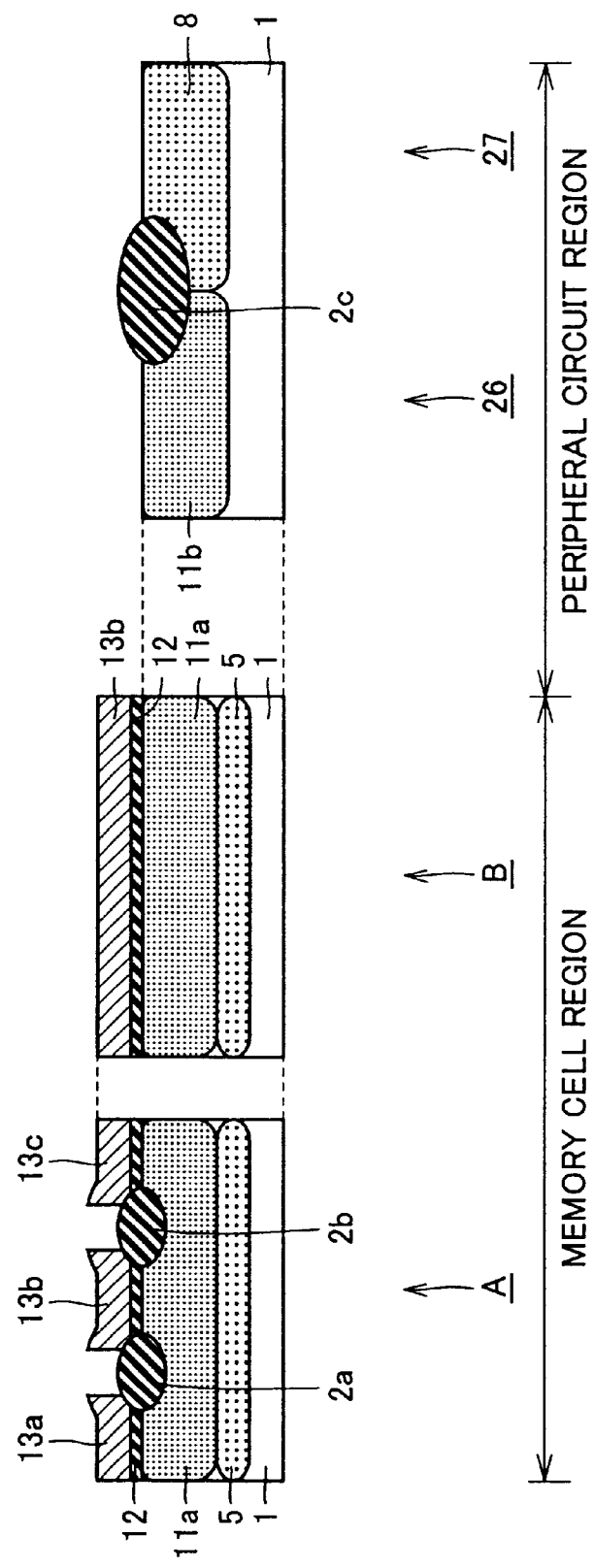

Then, a phosphorous doped polysilicon film 13 is formed on this silicon oxide film 12. This phosphorous doped polysilicon film 13 can be formed by using a low pressure CVD (chemical vapor deposition) method. In addition, the film thickness of this phosphorous doped polysilicon film 13 is 100 nm. A resist film is applied to the phosphorous doped polysilicon film 13. Then, a resist film 14 which has a predetermined pattern is formed, through a photolithographic method, on the phosphorous doped polysilicon film 13 in the memory cell region and at the same time the resist is removed in the peripheral circuit region so as to expose the upper surface of the phosphorous doped polysilicon film 13. This resist film 14 is formed so as to have a pattern of the floating gate in the memory cell region. By partially removing the phosphorous doped polysilicon film 13 through etching using this resist film 14 as a mask, as shown in FIG. 7, a phosphorous doped polysilicon film 13*a* to 13*c* which becomes floating gates of a flash memory is formed in the memory cell region. In addition, the phosphorous doped polysilicon film 13 (see FIG. 6) is removed, through this etching, in the peripheral circuit region. Next, the silicon oxide film 12 is removed from the peripheral circuit region by using the wet etching. After that, the resist film 14 is removed. In this manner, a structure as shown in FIG. 7 is gained.

Figure 8:
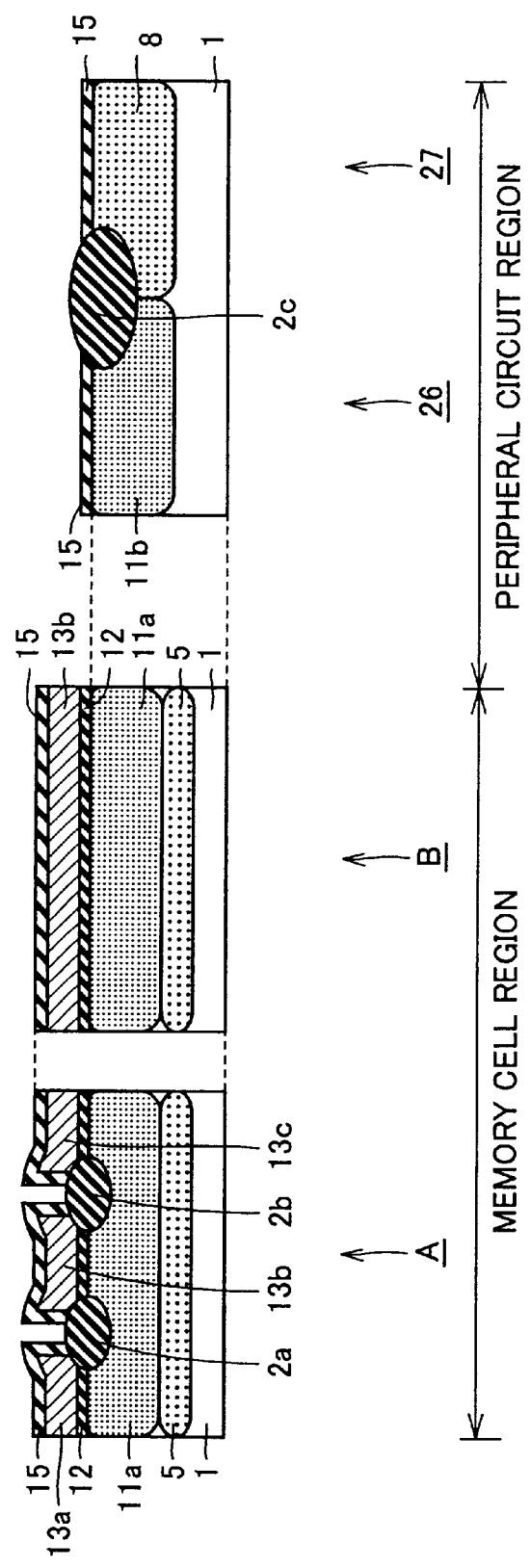
Figure 9:
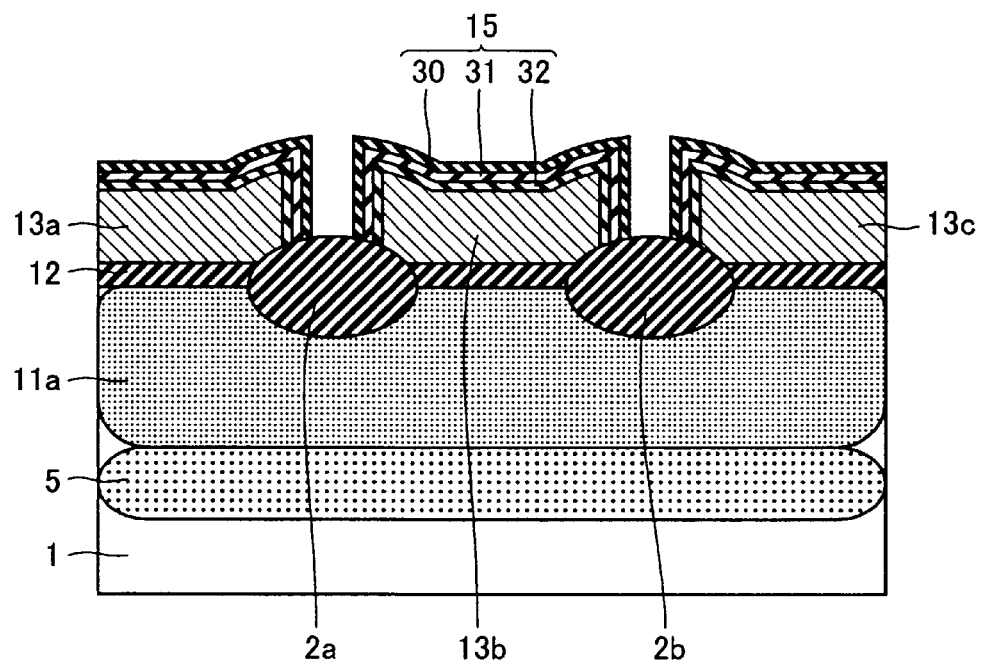
FIG. 9 is a schematic cross section view of an enlarged part of the nonvolatile semiconductor memory device shown in FIG. 8.

Next, as shown in FIGS. 8 and 9, a silicon oxide film 32 is formed as a first insulating film, by using a thermal oxidation method, on the phosphorous doped polysilicon film 13a to 13c and on the main surface of the semiconductor substrate 1 in the peripheral circuit region. The film thickness of this silicon oxide film 32 is, for example, 5 nm. Next, a silicon nitride film 31 is formed as a second insulating film on this silicon oxide film 32 by using a low pressure CVD method. The film thickness of the silicon nitride film 31 can be set at, for example, approximately 10 nm. Then, a silicon oxide film 30 is formed as an upper oxide film on this silicon nitride film 31 by using a low pressure VCD method. The film thickness of this silicon oxide film 30 can be set at, for example, approximately 5 nm. In this manner, the three layered insulating film 15 made of the silicon oxide film 32, the silicon nitride film 31 and the silicon oxide film 30 is formed on the phosphorous doped polysilicon film 13a to 13c as well as on the main surface of the semiconductor substrate 1 in the peripheral circuit region.

This three layered insulating film 15 becomes an intermediate insulating film located between the floating gate electrode and the control gate electrode in a flash memory cell. In addition, the three layered insulating film 15 formed in the peripheral circuit region becomes the gate insulating film of the n type FET 26 and the p type FET 27. In this manner, the intermediate insulating film located on the phosphorous doped polysilicon film 13a to 13c which becomes the lower electrode of a flash memory cell which serves as a first semiconductor element and the gate insulating film of the n type FET 26 and the p type FET 27 as a second semiconductor element can be formed in one sequence of steps as the above described three layered insulating film. Accordingly, a simplification of the steps can be achieved in comparison with the conventional case where the intermediate insulating film of a flash memory cell and the gate insulating film of the n type FET 26 and the p type FET 27 are formed in different steps.

In addition, by changing the film thickness or the like of the silicon oxide film 32, 30 and the silicon nitride film 31, it becomes possible to arbitrarily change the electrical characteristics of the flash memory cells, the n type FET 26 and the p type FET 27.

In addition, since the three layered insulating film 15 is used as the gate insulating film of the n type FET 26 and the p type FET 27, the dielectric strength of the gate insulating film can be increased without fail.

Figure 10:
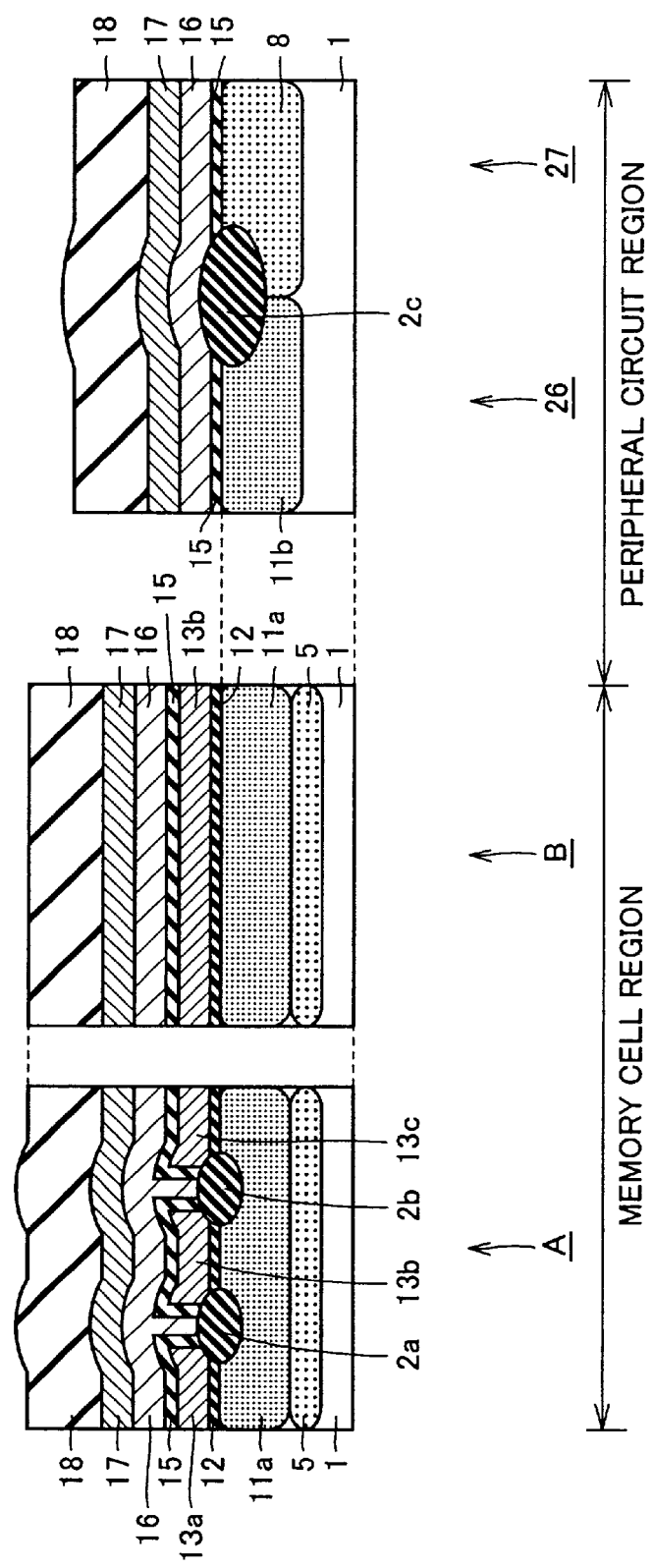
FIGS. 10 to 14 are schematic cross section views for describing the eighth to the twelfth steps of the process of the nonvolatile semiconductor memory device shown in FIG. 1.

Next, as shown in FIG. 10, a phosphorous doped polysilicon film 16 is formed on the three layered insulating film 15 both in the memory cell region and in the peripheral circuit region. This phosphorous doped polysilicon film 16 is formed by using a low pressure CVD method. In addition, the film thickness of this phosphorous doped polysilicon film 16 is 200 nm. A tungsten silicide film 17 is formed on this phosphorous doped polysilicon film 16. The film thickness of this tungsten silicide film 17 is 200 nm. Then, a silicon oxide film 18 is additionally formed on the tungsten silicide film 17.

Figure 11:
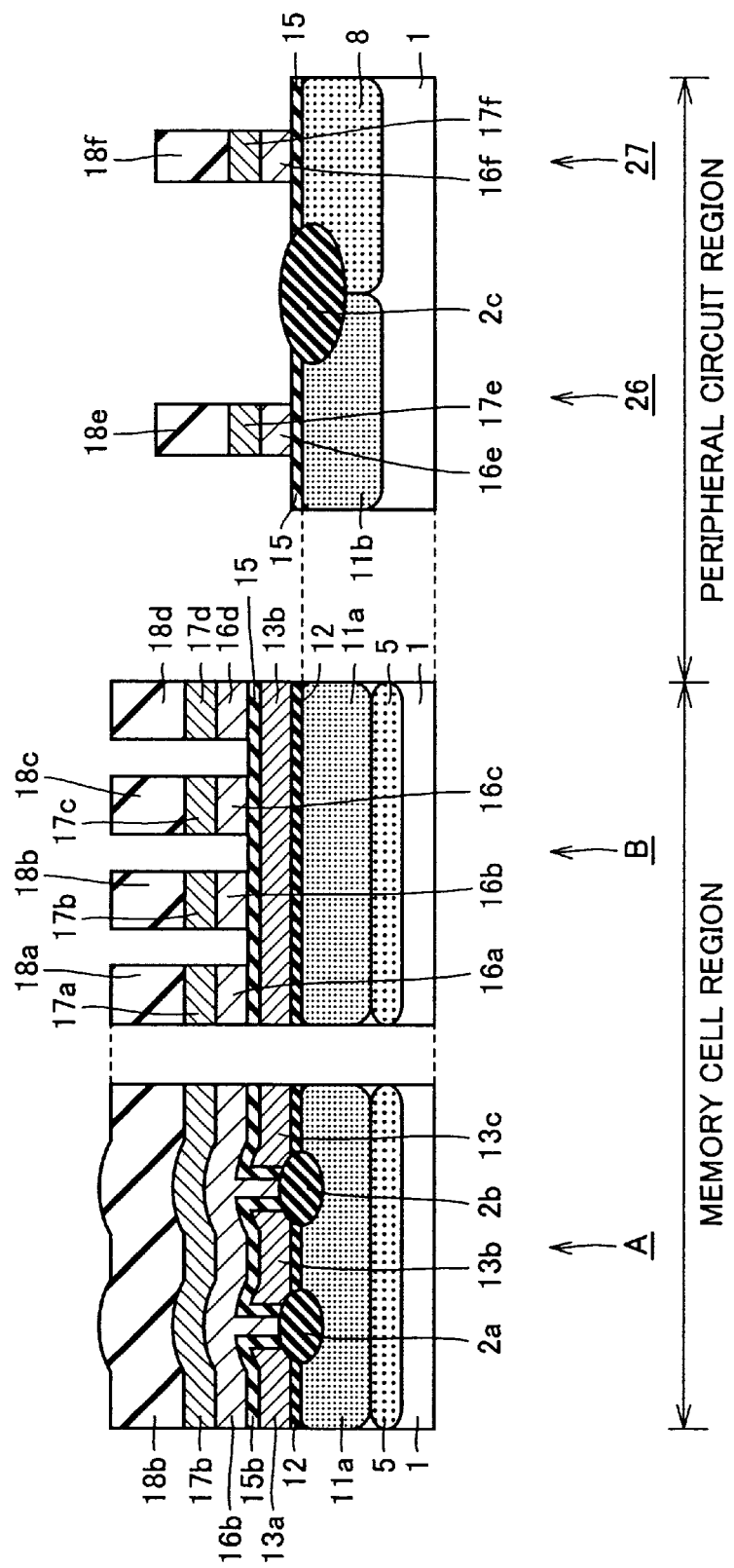

Next, a resist film (not shown) which has a predetermined pattern is formed on the silicon oxide film 18 by using a photolithographic method. By partially removing the silicon oxide film 18 using this resist film as a mask, a silicon oxide film 18a to 18f is formed as shown in FIG. 11. In addition, by partially removing the tungsten silicide film 17 through etching, a tungsten silicide film 17a to 17f is formed as shown in FIG. 11.

After that, the resist film is removed. Then, by partially removing the phosphorous doped polysilicon film 16 using this silicon oxide film 18a to 18f as a mask, a phosphorous doped polysilicon film 16a to 16f is formed as shown in FIG. 11. In this manner, the structure as shown in FIG. 11 is gained. At this time, the phosphorous doped polysilicon film 16a to 16b in the memory cell region works as control gate electrodes of the flash memory cells which serve as memory elements. Then, in the peripheral circuit region, the phosphorous doped polysilicon film 16e, 16f becomes the gate electrodes of the n type FET 26 and the p type FET 27, respectively.

Figure 12:
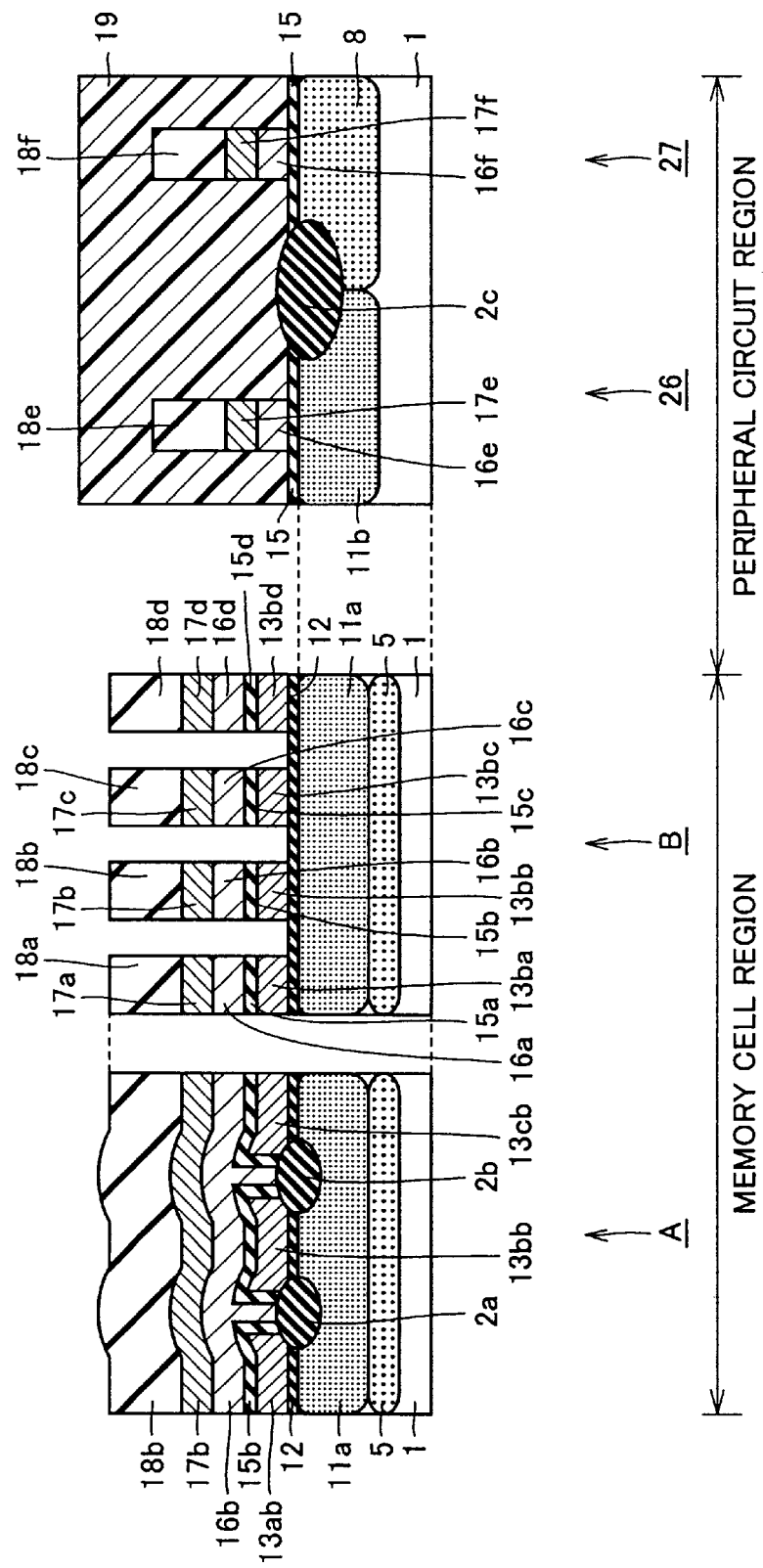

Next, a resist film 19 is formed, by using a photolithographic method, so as to cover the regions wherein the n type FET 26 and the p FET 27 are to be formed in the peripheral circuit region. Under this condition, the three layered insulating film 15 and the phosphorous doped polysilicon film 13a to 13c are partially removed by using the silicon oxide film 18a to 18d as a mask in the memory cell region. In this manner, the structure as shown in FIG. 12 is gained. This sequence of steps forms the pieces of the phosphorous doped polysilicon film 13ba, 13bb, 13bc, 13bd as floating gate electrodes arranged at intervals in the direction perpendicular to the direction in which the word lines of the flash memory cells extend (direction in which the pieces of the phosphorous doped polysilicon film 16a to 16b extend as control gate electrodes) as shown in FIG. 12. In addition, the other pieces of phosphorous doped polysilicon film 13a, 13c shown in FIG. 7 also become the pieces of the phosphorous doped polysilicon film 13ab, 13cb as shown in FIG. 12 by being divided, in the same manner, in the direction approximately perpendicular to the direction in which the lines extend. That is to say, the pieces of the phosphorous doped polysilicon film 13ab, 13cb, 13ba, 13bb, 13bc, 13bd are in the condition wherein they are arranged as floating gate electrodes in a matrix form above the semiconductor substrate 1.

Figure 13:
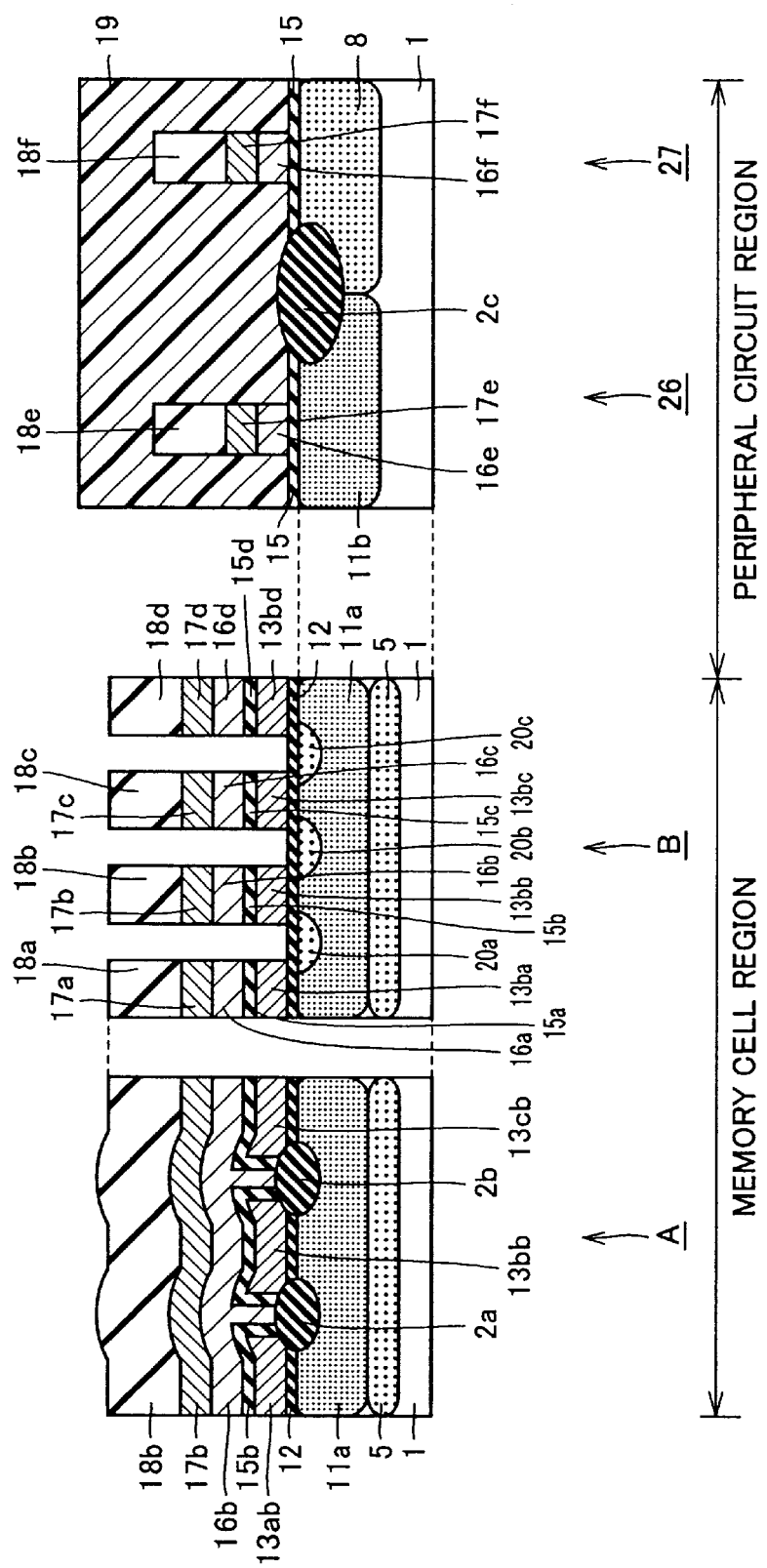

Then, arsenic ions are injected into the semiconductor substrate 1 located beneath the region wherein the upper surface of the silicon oxide film 12 is exposed in the memory cell region. As for the conditions for this arsenic ion injection, for example, the conditions wherein the injection energy is 40 keV and the injection concentration is $2.0 \times 10^{15}/cm^2$ can be used. After that heat treatment is carried out by placing the semiconductor substrate 1 in a nitrogen atmosphere. As for the conditions for this heat treatment, the conditions where the atmospheric temperature is 850° C. and the heating time is 30 min are used. The arsenic ions are activated through such a heat treatment. As a result of this, the n type diffusion regions 20a to 20c are formed in the main surface of the semiconductor substrate 1 as shown in FIG. 13. In this manner, the structure as shown in FIG. 13 is gained. After that, the resist film 19 is removed.

Next, a resist film (not shown) is formed in a region other than the region wherein the n type FET 26 is to be formed in the peripheral circuit region by using a photolithographic method. Under the condition, where this resist film exists, arsenic ions are injected into the main surface of the semiconductor substrate 1 of the peripheral region. As for the condition for this injection, the conditions where the injection energy is 50 keV and the injection concentration is $3.0 \times 10^{15}/cm^2$ can be used. After that, the resist film is removed. Subsequently, a resist film is formed in a region other than the region wherein the p type FET 27 is to be formed in the peripheral circuit region. Then, by using this resist film as a mask, $BF_2$ ions are injected into the main surface of the semiconductor substrate 1 in the region wherein the p type FET 27 is to be formed in the peripheral circuit region. As for the condition for this injection, the injection energy is 30 keV and the injection concentration is $3.0 \times 10^{15}/cm^2$.

Figure 14:
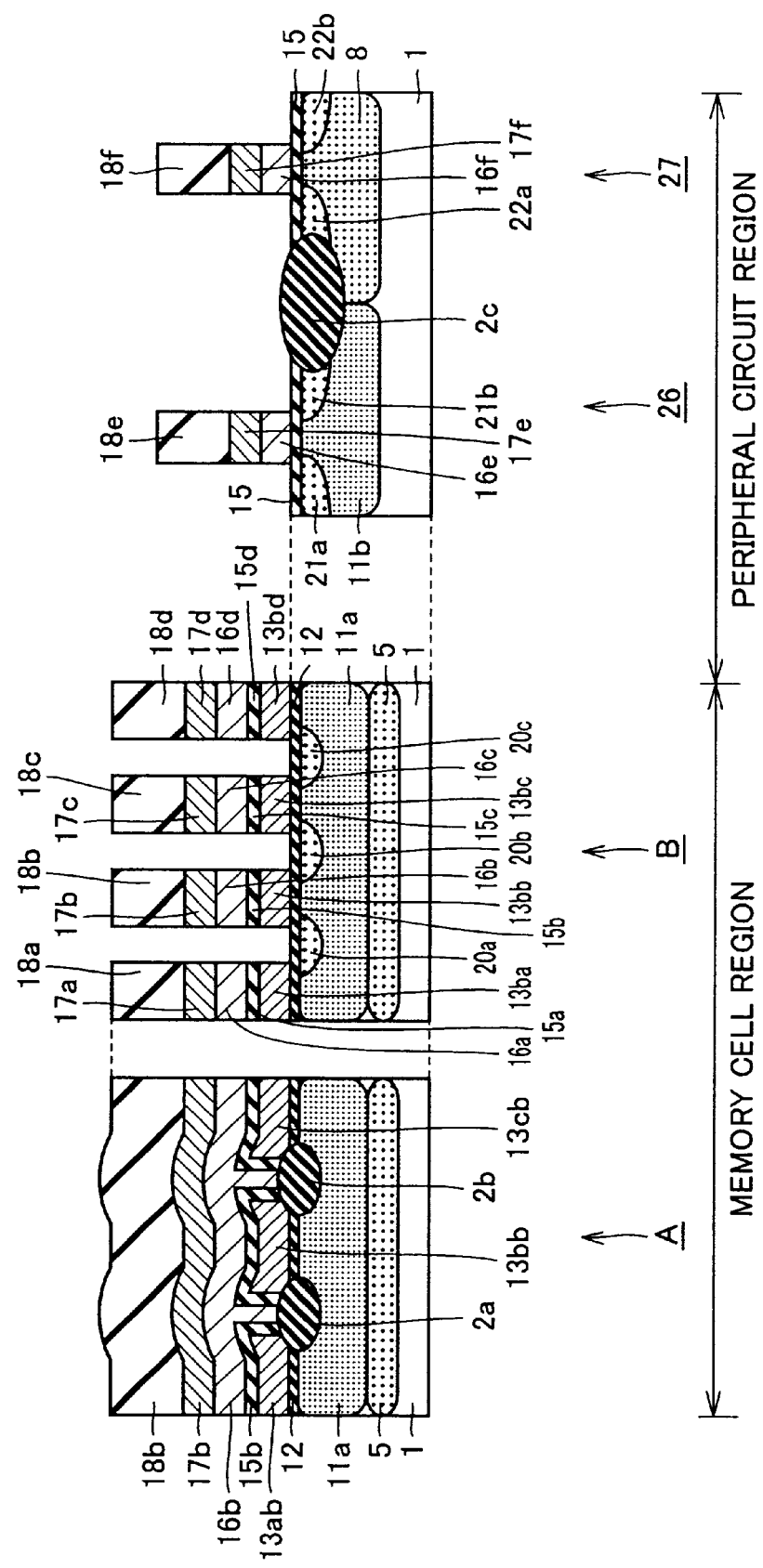
Figure 15:
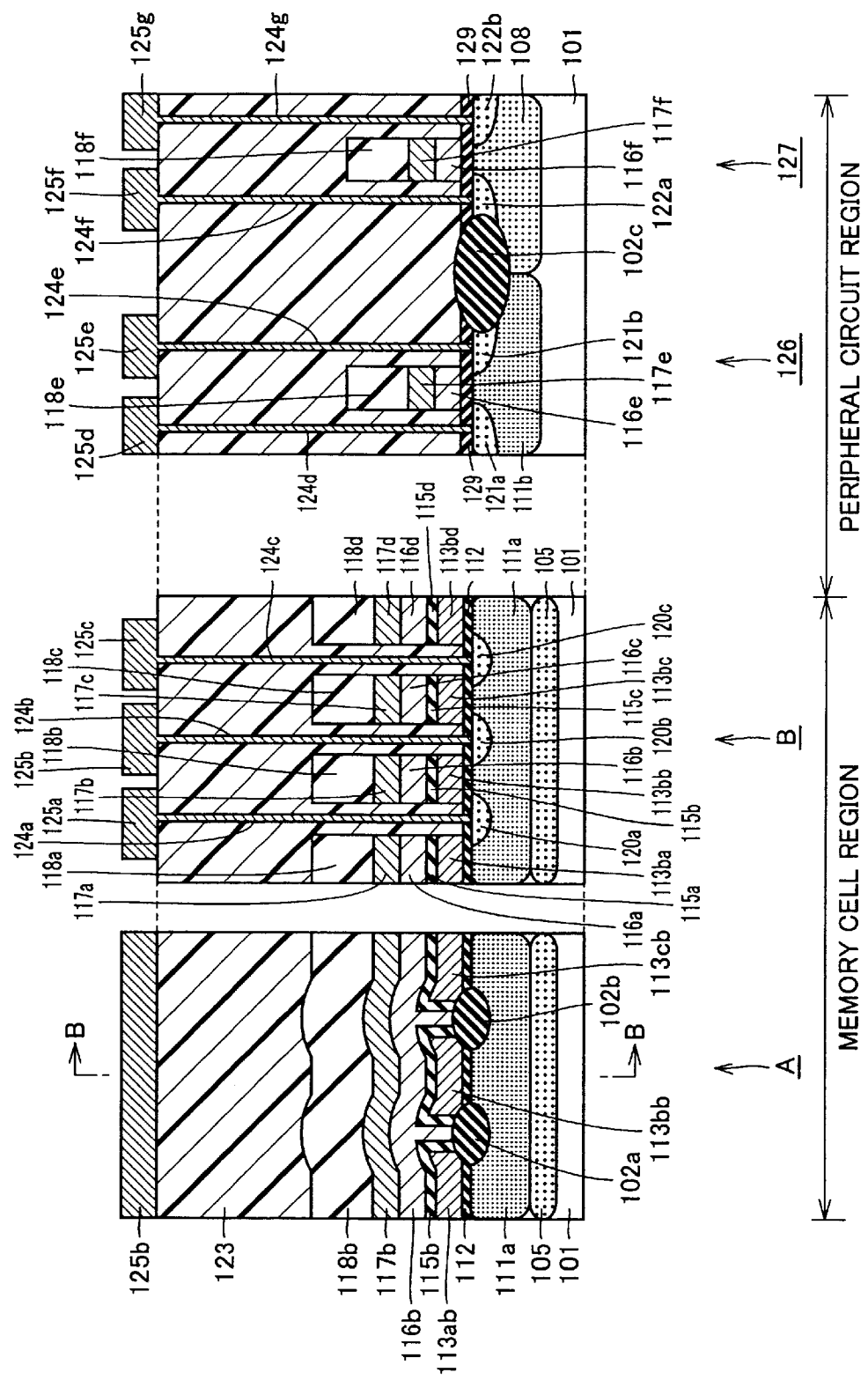
FIG. 15 is a schematic cross section view showing a nonvolatile semiconductor memory device according to a prior art.
Figure 16:
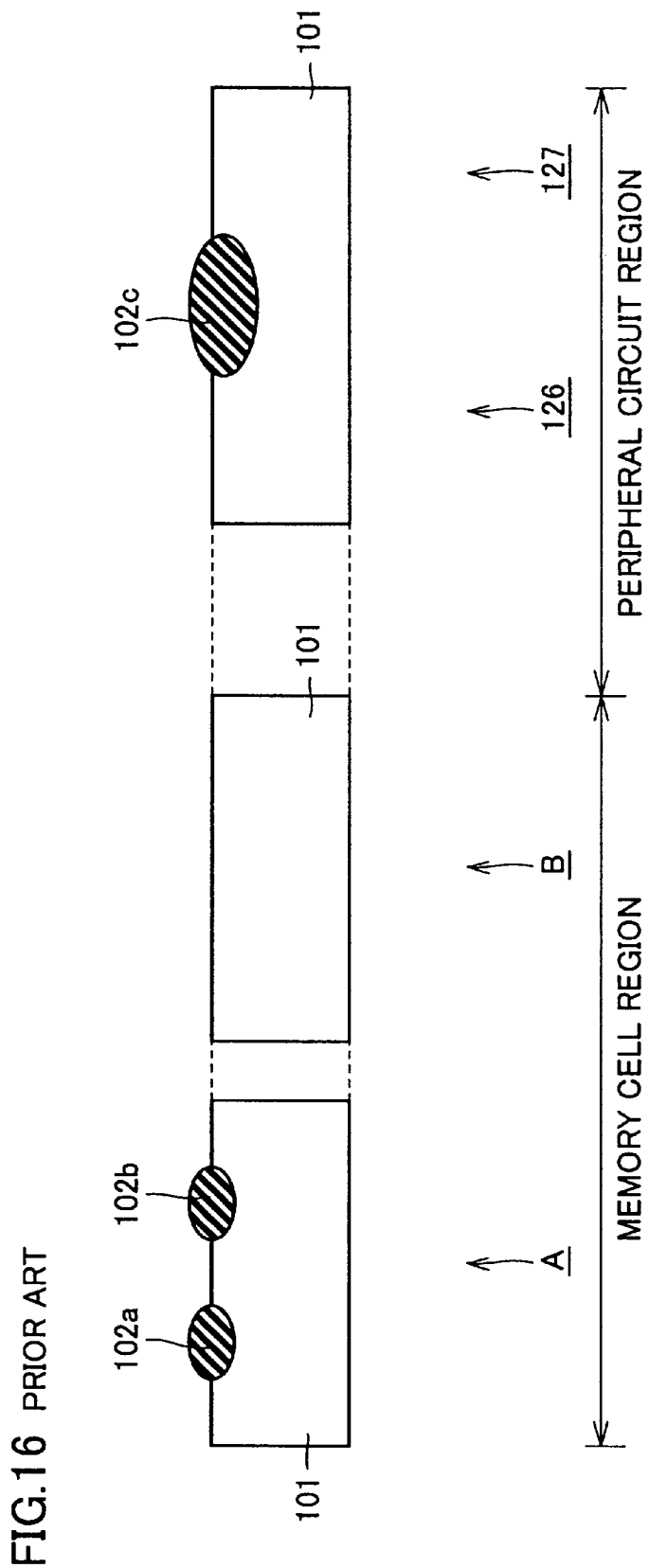
FIGS. 16 to 27 are schematic cross section views for describing the first to the twelfth steps of a process for the conventional nonvolatile semiconductor memory device shown in FIG. 15.
Figure 17:
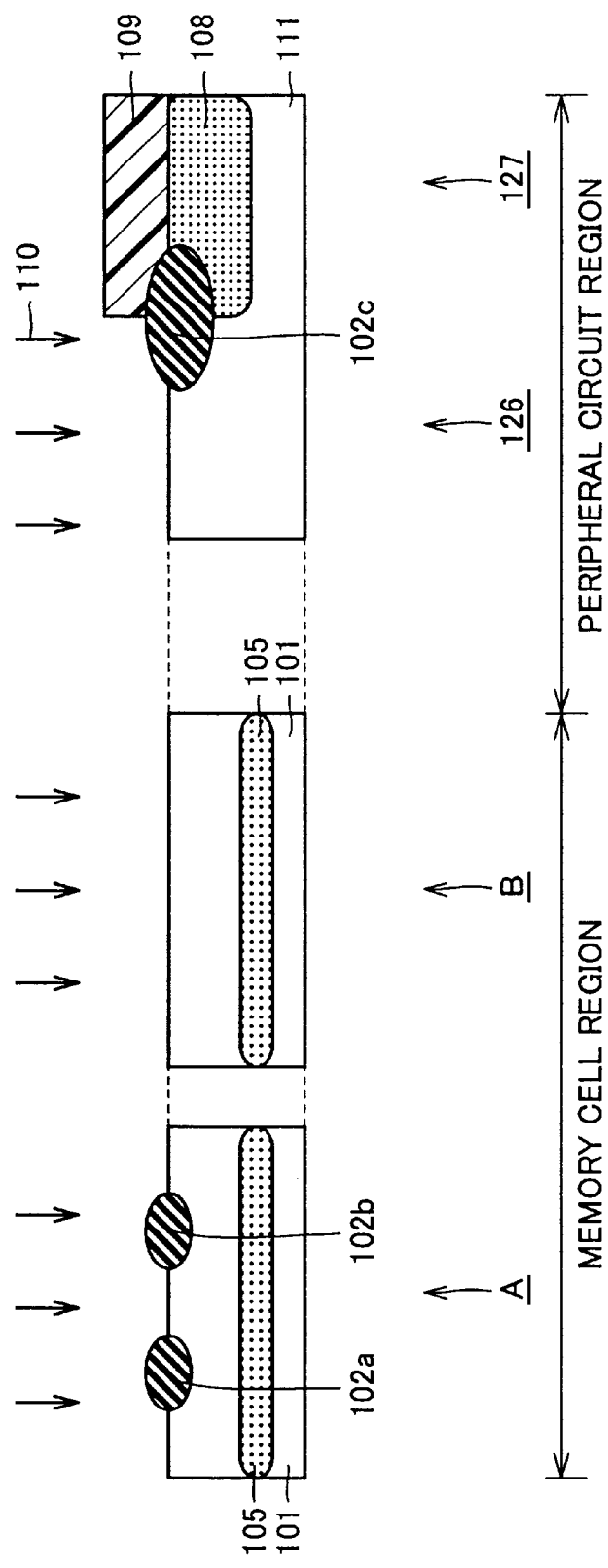
Figure 18:
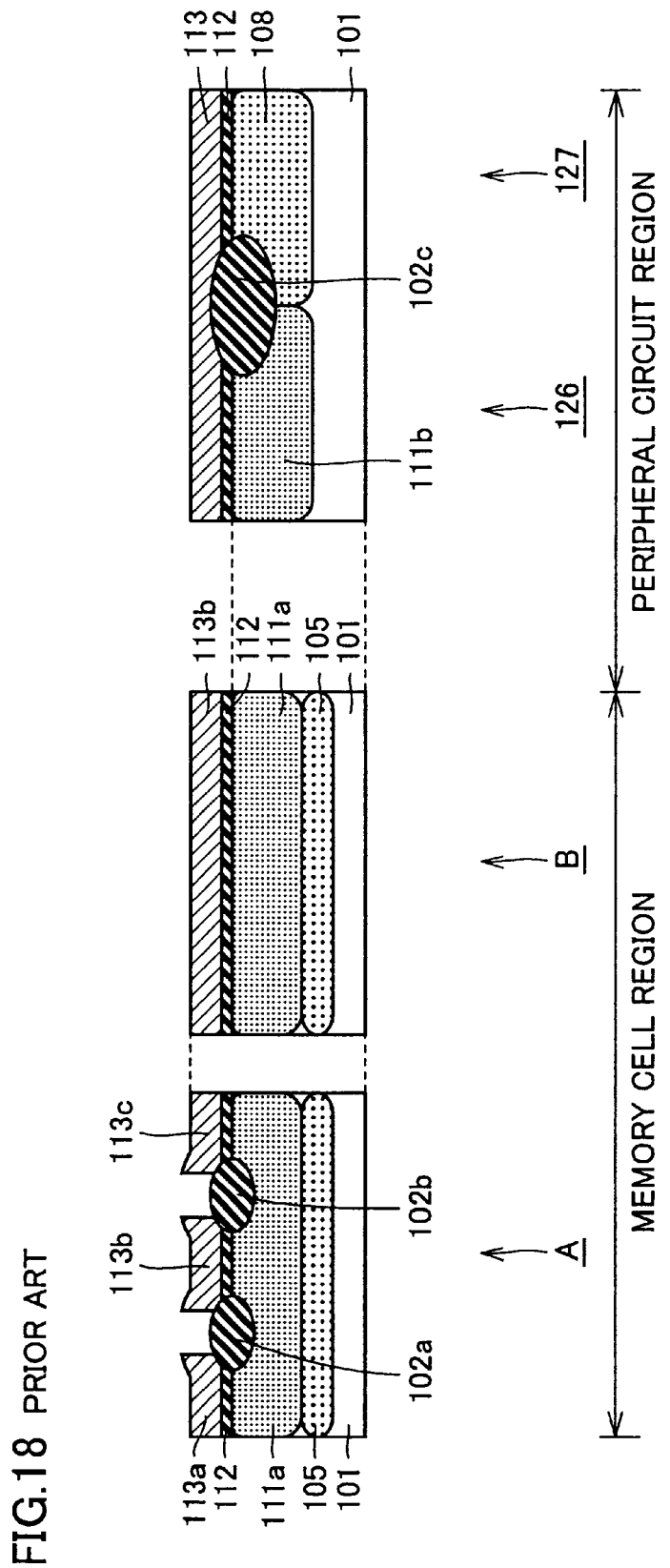
Figure 19:
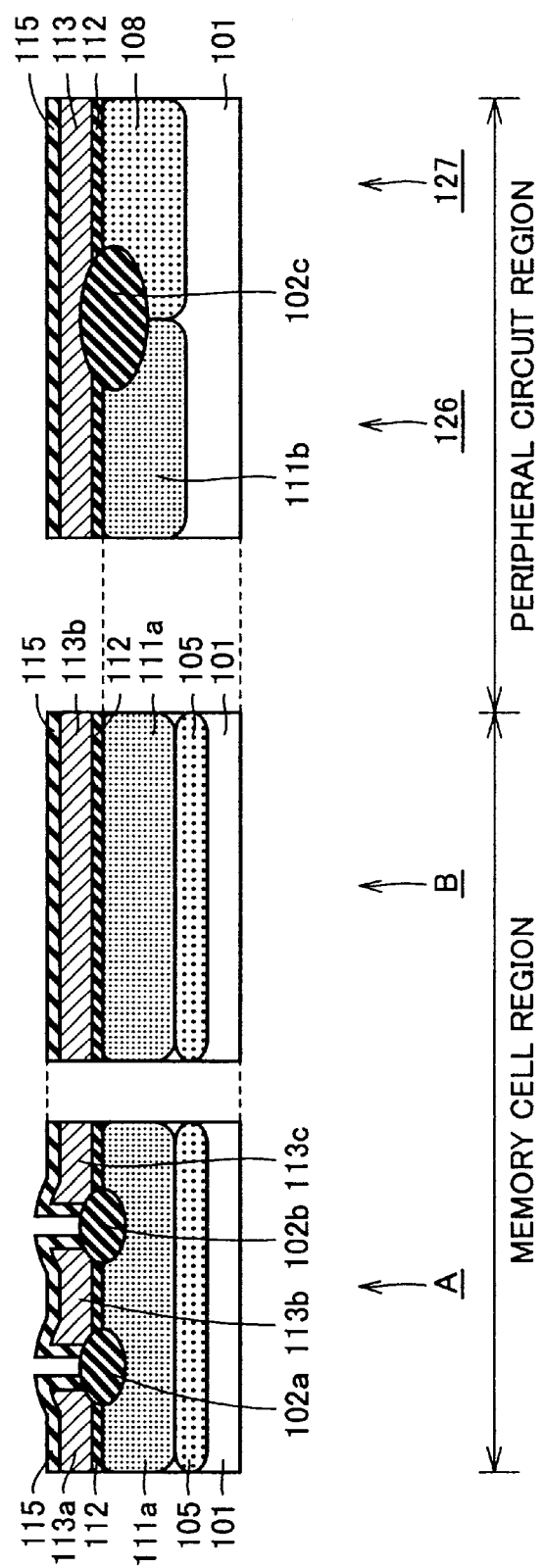
Figure 20:
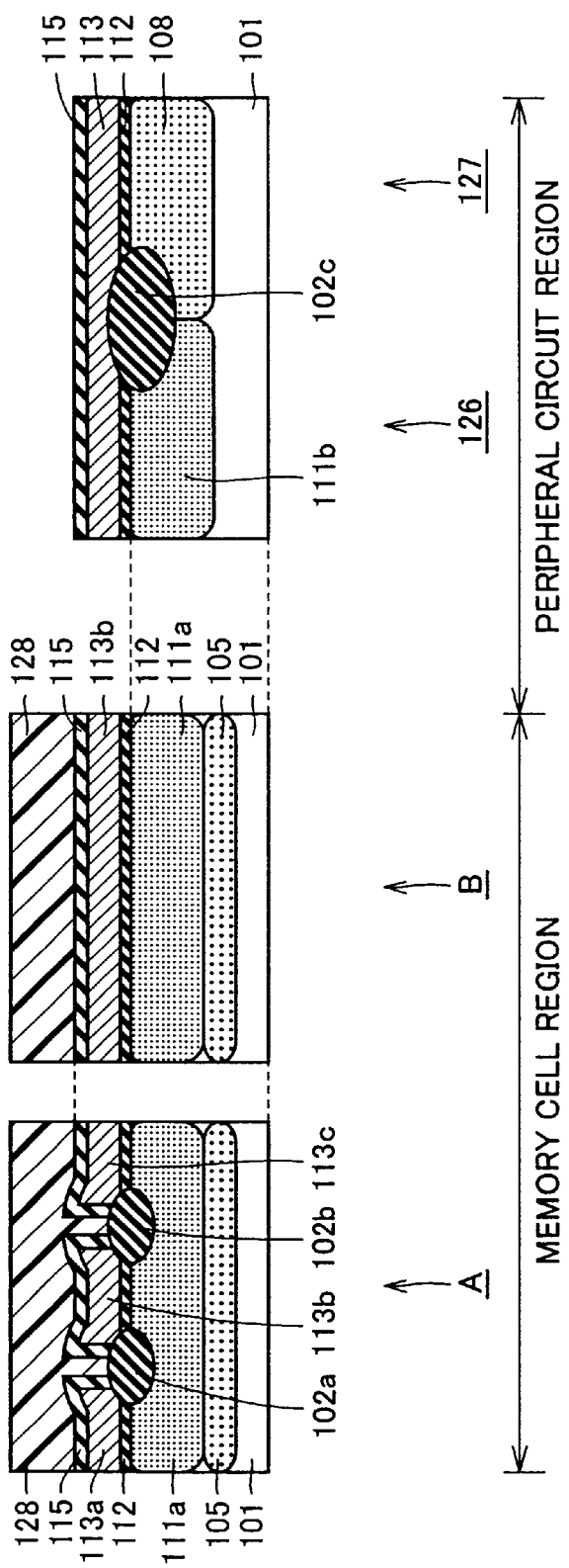
Figure 21:
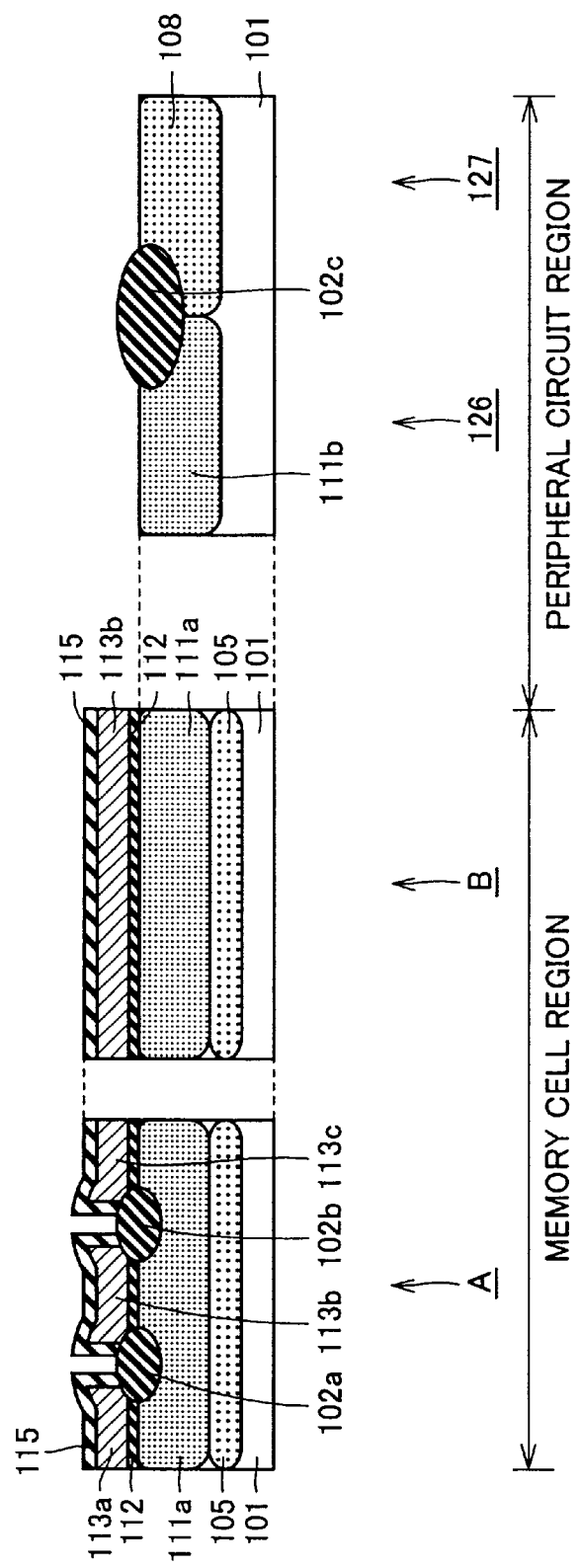
Figure 22:
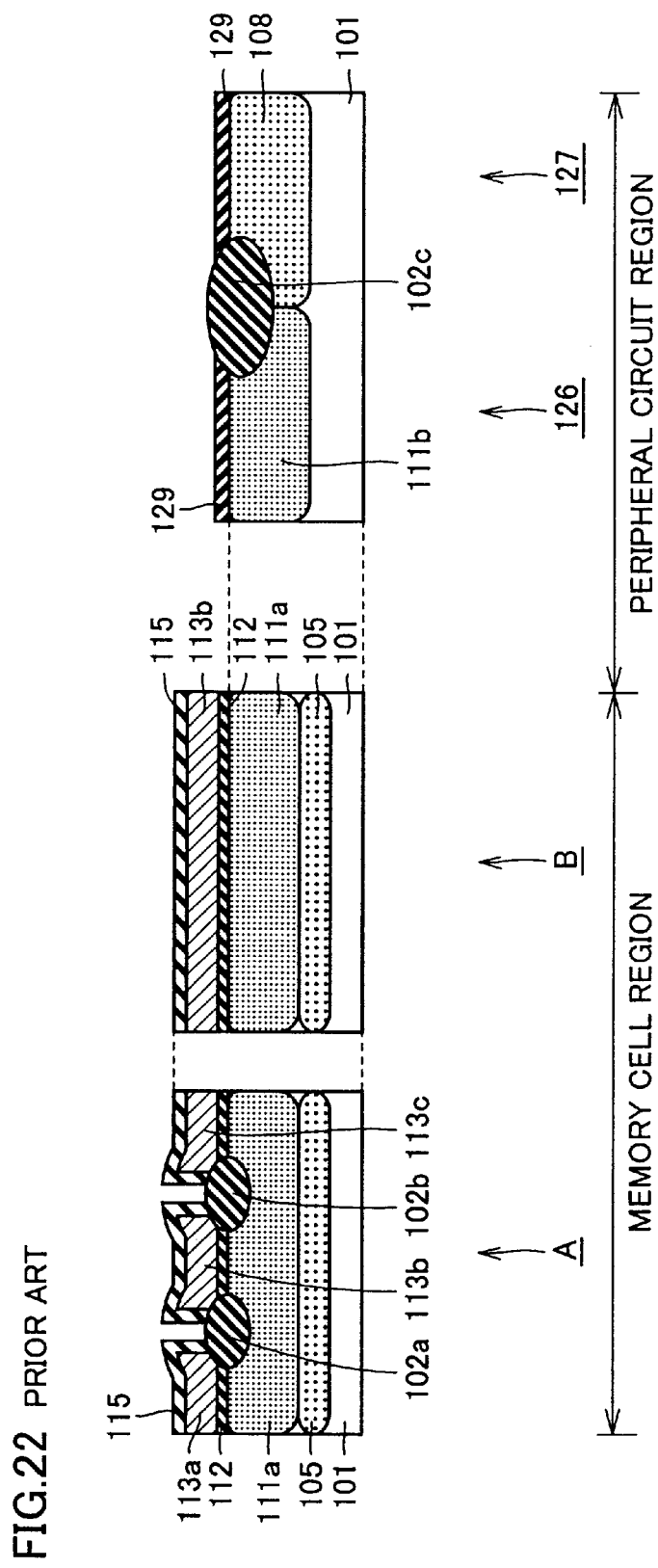
Figure 23:
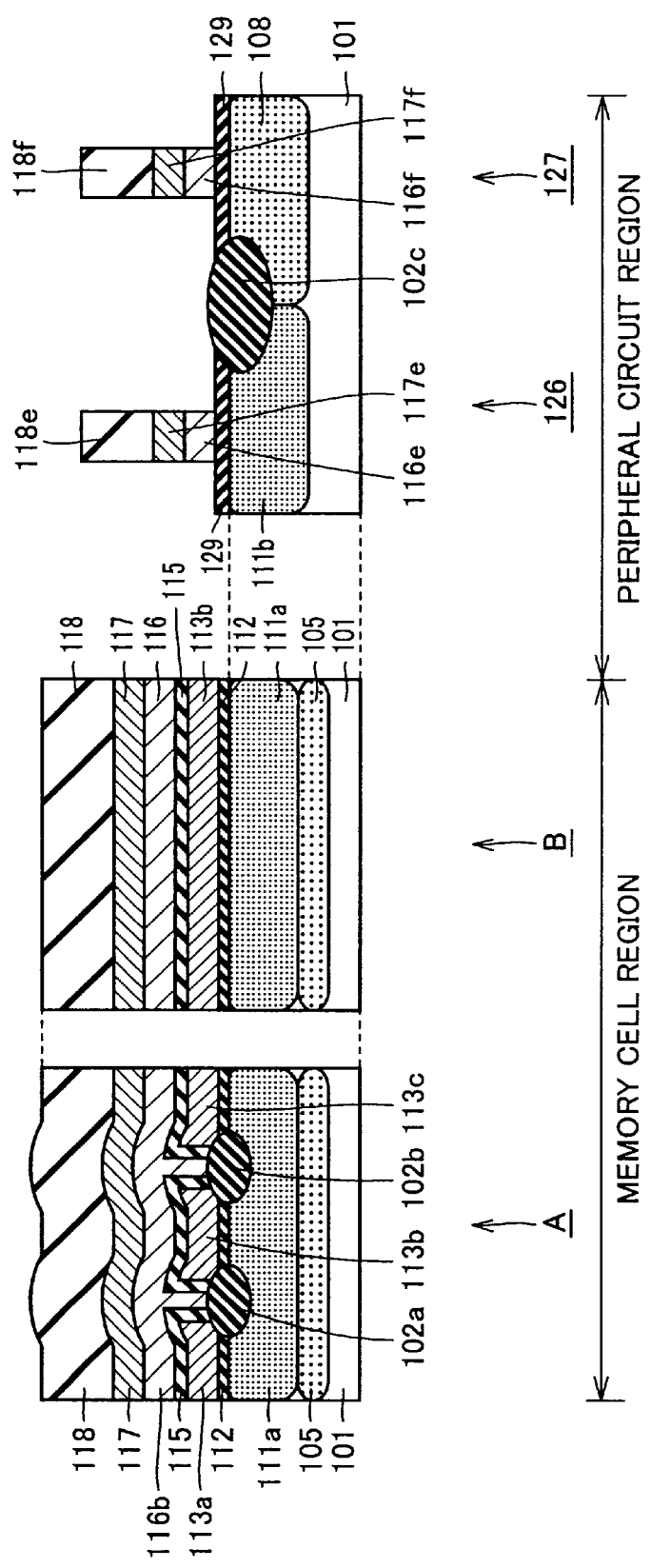
Figure 24:
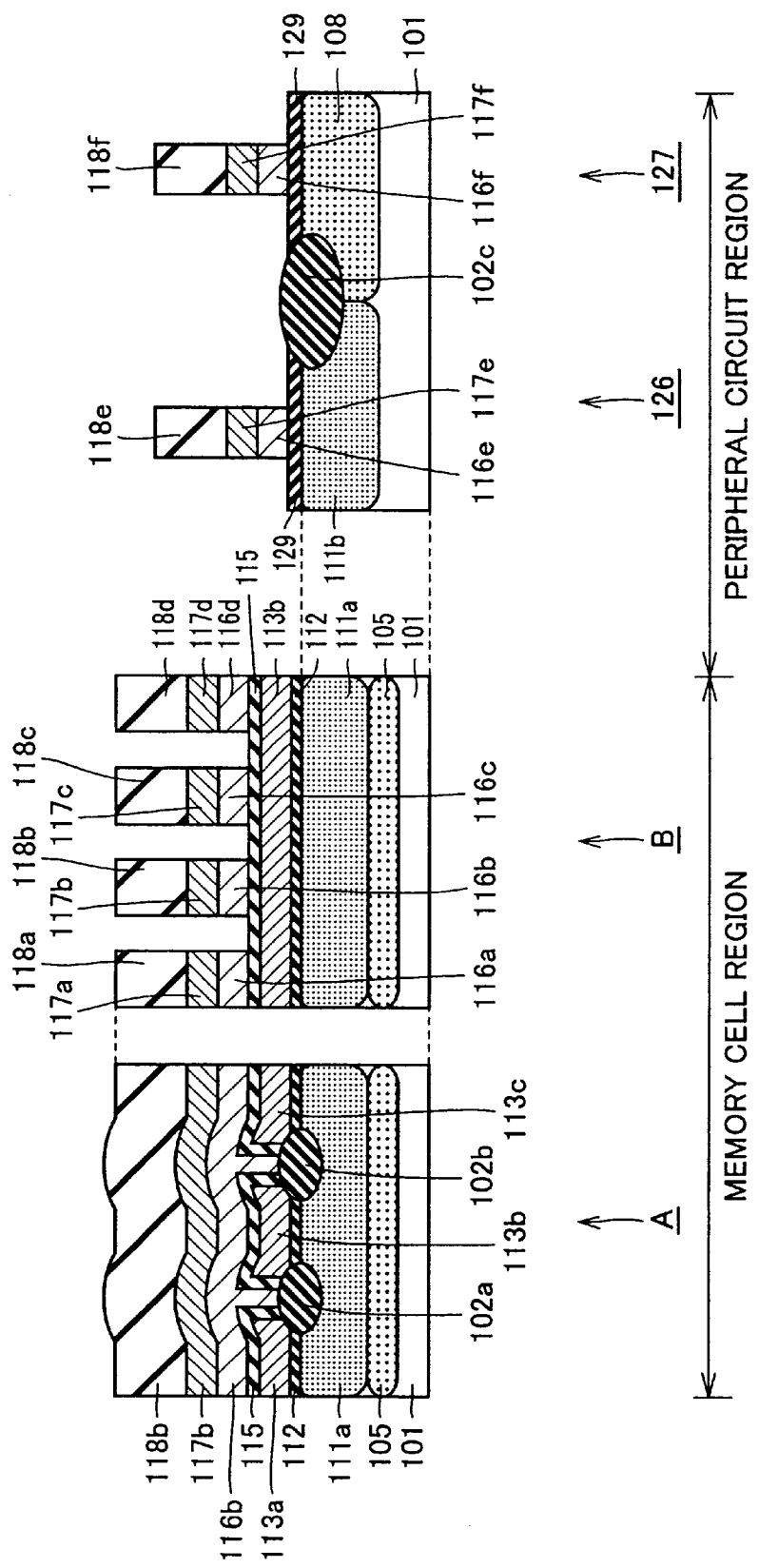
Figure 25:
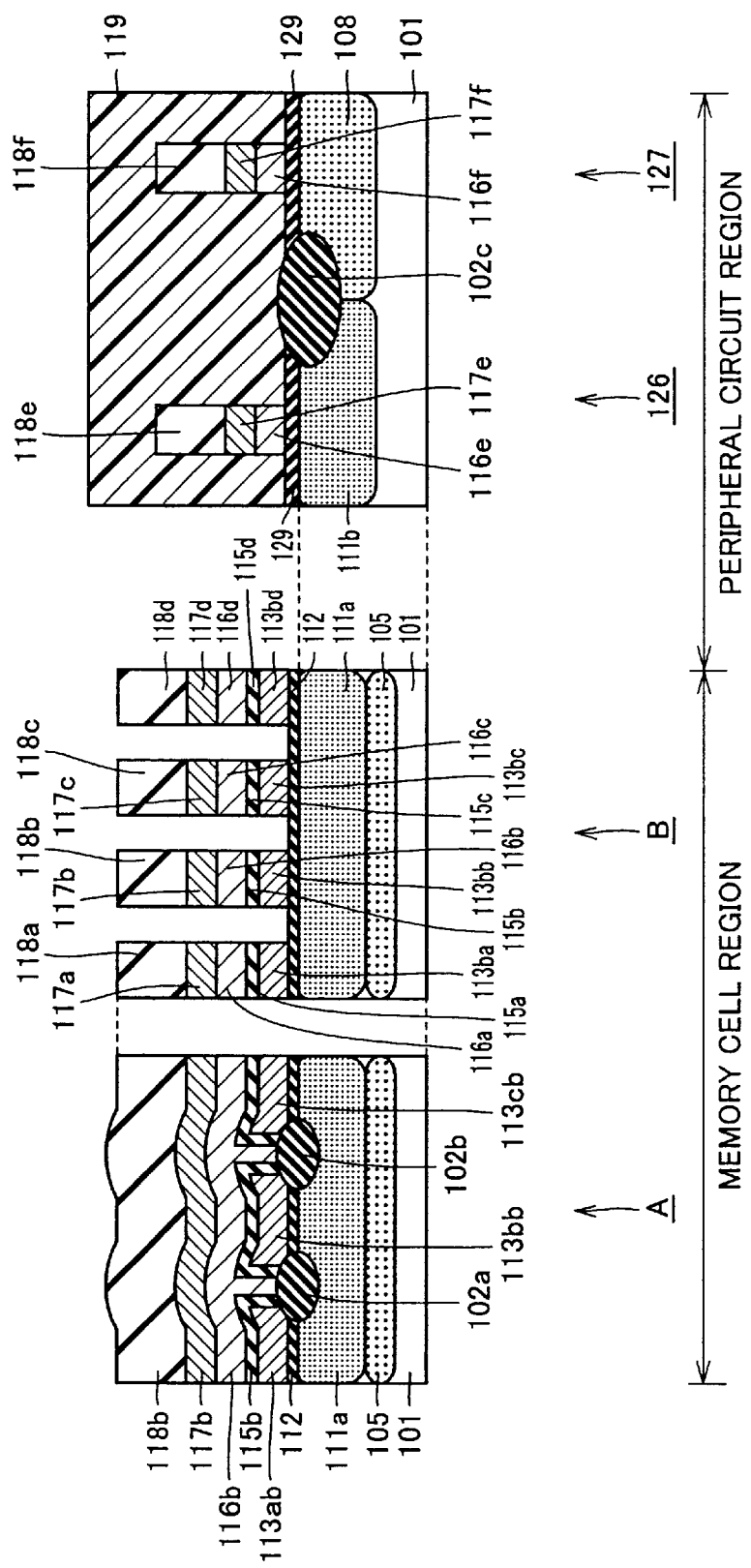
Figure 26:
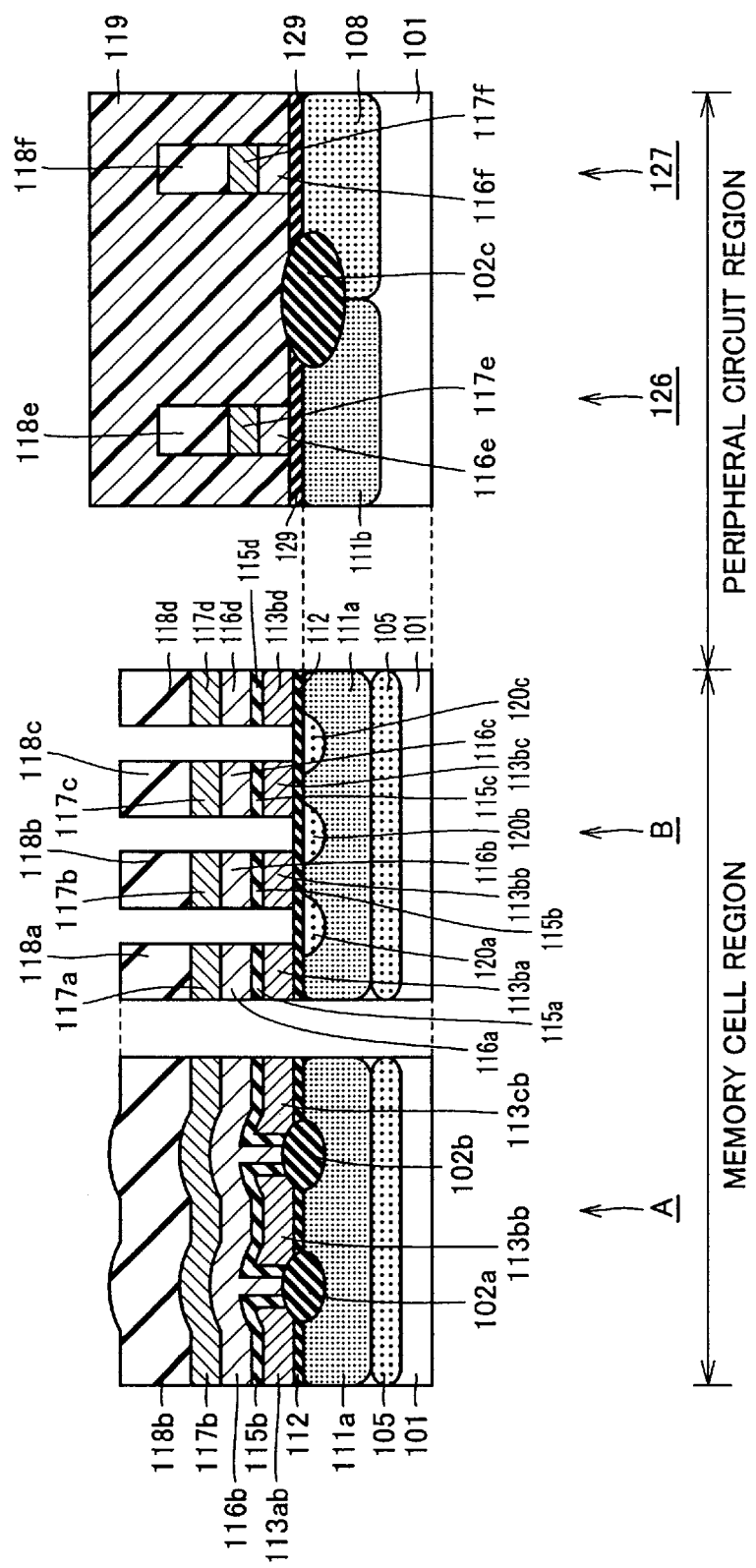
Figure 27:
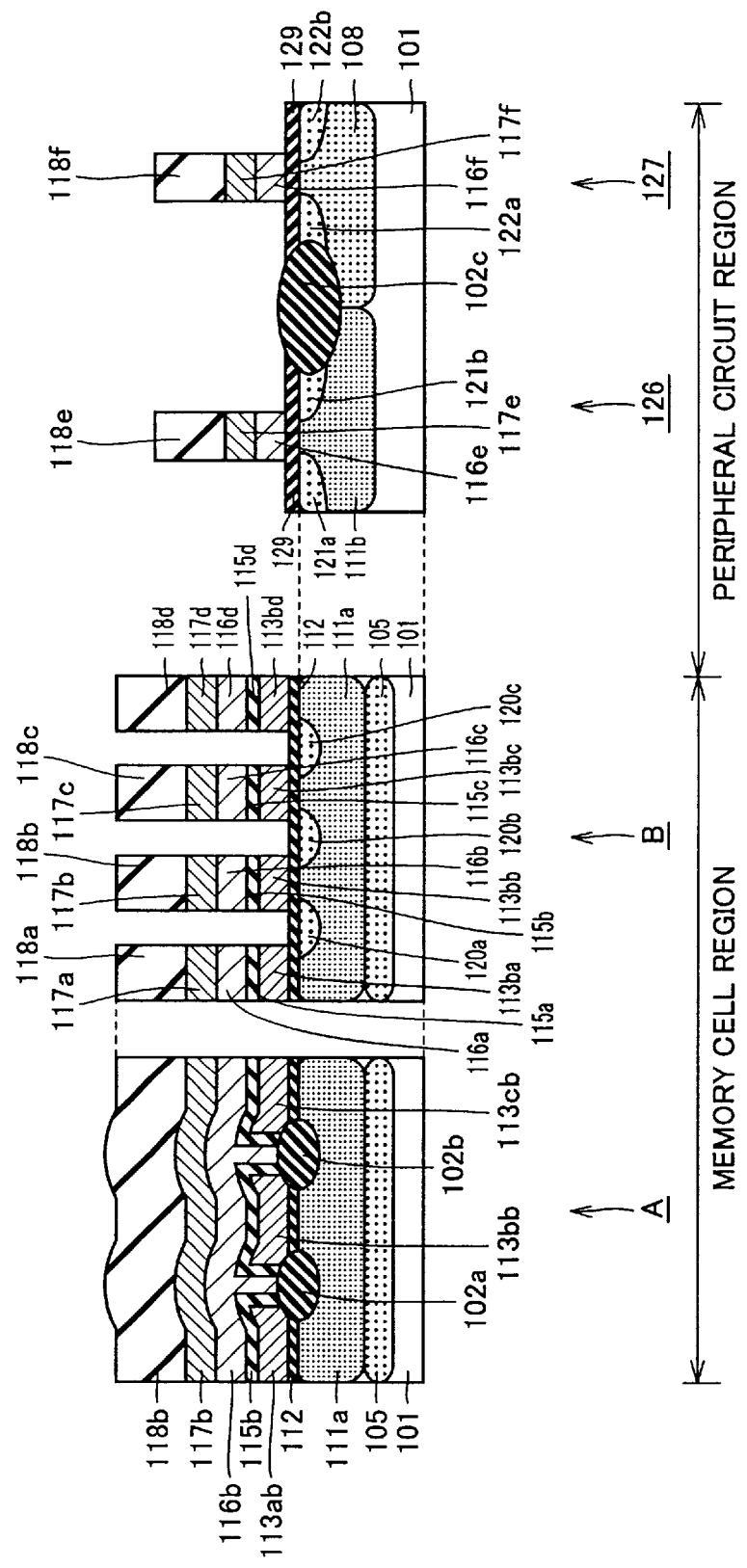

After that, the semiconductor substrate 1 undergoes a heat treatment. As for the conditions for this heat treatment, a nitrogen atmosphere is used wherein the atmospheric temperature is 800° C. and the substrate is maintained at this temperature for 30 min. By activating, through such a heat treatment, the conductive impurities such as the arsenic ions injected in the semiconductor substrate 1 in the peripheral circuit region, the n type diffusion regions 21a, 21b and the p type diffusion regions 22a, 22b are formed. In this manner, the structure as shown in FIG. 14 is gained.

Next, boron phosphorous glass 23 is formed on the silicon oxide film 18a to 18f by using a CVD method. The film thickness of this boron phosphorous glass 23 is 1000 nm. Then, the boron phosphorous glass is hardened by means of a heat treatment. As for the conditions for this heat treatment, the semiconductor substrate 1 is placed in a nitrogen atmosphere and conditions wherein the atmospheric temperature is, for example, 850° C. and the heating time is 30 min are used.

A resist film (not shown) is formed on this boron phosphorous glass 23 by using a photolithographic method. By partially removing the boron phosphorous glass 23, the silicon oxide film 12 and the three layered insulating film 15 using the above resist film as a mask, contact holes 24a to 24g (see FIG. 1) are formed. After this, the resist film is removed. Then, by using a sputtering method, an aluminum-silicon-copper (Al—Si—Cu) alloy film is formed as a conductive film so as to extend from the inside of the contact holes 24a to 24g to the upper surface of the boron phosphorous glass 23. A resist film which has an interconnection pattern is formed on this alloy film by using a photolithographic method. By using this resist film as a mask, the Al—Si—Cu alloy film is partially removed through etching. After that, the resist film is removed. In this manner, the interconnections 25a to 25g are formed as shown in FIG. 1. In this manner, the nonvolatile semiconductor memory device shown in FIG. 1 can be gained.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A process for fabricating a semiconductor device comprising first and second semiconductor elements comprising:

the step of forming a lower electrode in a region wherein said first semiconductor element is formed within a region wherein said first and second semiconductor elements are formed above a semiconductor substrate;

the step of forming a multilayered insulating film which extends from said lower electrode in the region wherein said first semiconductor element is formed to said semiconductor substrate in the region wherein said second semiconductor element is formed;

the step of forming a conductive film on said multilayered insulating film so as to extend above the region wherein said first and second semiconductor elements are formed; and the step of forming an upper electrode located on said multilayered insulating film in the region wherein said first semiconductor element is formed and of forming a gate electrode located on said multilayered insulating film in the region wherein said second semiconductor element is formed by partially removing said conductive film through etching.

2. The process for fabricating a semiconductor device according to claim 1, comprising the step of forming a lower insulating film which is located beneath said lower electrode and which has a film thickness smaller than that of said multilayered insulating film in the region wherein said first semiconductor element is formed.

3. The process for fabricating a semiconductor device according to claim 1, wherein the step of forming said multilayered insulating film includes:

the step of forming a first insulating film that extends from said lower electrode in the region wherein said first element is formed to said substrate in the region wherein said second semiconductor element is formed; and the step of forming a second insulating film on said first insulating film.

4. The process for fabricating a semiconductor device according to claim 3, wherein:

said first insulating film is an oxide film;

said second insulating film is a nitride film; and the step of forming said multilayered insulating film further includes the step of forming an upper oxide film on said nitride film.

5. The process for fabricating a semiconductor device according to claim 1, wherein the first semiconductor element is a transistor in a memory cell in a nonvolatile semiconductor device;

the second semiconductor element is a peripheral transistor in a peripheral region of the memory cell in the nonvolatile semiconductor device;

the lower electrode is a floating gate electrode constituting the memory cell; and the upper electrode is a control gate electrode constituting the memory cell.

6. A The process for fabricating a semiconductor device according to claim 2, wherein the steps of forming said multilayered insulating film and forming a lower insulating film include thermal oxidation.

* * * * *